(12) United States Patent
Koto et al.

(10) Patent No.: US 10,483,636 B1
(45) Date of Patent: Nov. 19, 2019

(54) ELECTROMAGNETIC WAVE SHIELD BOX

(71) Applicant: Anritsu Corporation, Kanagawa (JP)

(72) Inventors: Joji Koto, Kanagawa (JP); Tomohiko Maruo, Kanagawa (JP); Tomonori Morita, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 16/409,947

(22) Filed: May 13, 2019

(30) Foreign Application Priority Data

Aug. 24, 2018 (JP) ................. 2018-157121

(51) Int. Cl.
*H04B 17/20* (2015.01)
*H01Q 1/38* (2006.01)
*H01Q 9/04* (2006.01)
*H01Q 1/52* (2006.01)
*H01Q 1/24* (2006.01)

(52) U.S. Cl.
CPC ............ *H01Q 1/526* (2013.01); *H01Q 1/243* (2013.01); *H01Q 1/38* (2013.01); *H01Q 9/0428* (2013.01); *H04B 17/20* (2015.01)

(58) Field of Classification Search
CPC .......... H01Q 1/526; H01Q 1/243; H01Q 1/38; H01Q 9/0428; H04B 17/20
See application file for complete search history.

(56) References Cited

U.S. PATENT DOCUMENTS

| 10,333,631 | B2 * | 6/2019 | Rowell ............... H04B 17/101 |
| 10,396,909 | B1 * | 8/2019 | Cardalda-Garcia .... H04B 17/15 |
| 2016/0233970 | A1 * | 8/2016 | Reed ................. H04B 17/29 |
| 2018/0088162 | A1 * | 3/2018 | Ndip ................. H04B 17/27 |

FOREIGN PATENT DOCUMENTS

JP 2004-080271 A 3/2004

* cited by examiner

*Primary Examiner* — David Bilodeau
(74) *Attorney, Agent, or Firm* — Pearne & Gordon LLP

(57) ABSTRACT

An electromagnetic wave shield box 50 accommodates a DUT 100 having an antenna 110 and a coupling antenna 80 that is spatially coupled to the antenna 110, and includes a coupling antenna holding module 70 that arranges a plurality of the coupling antennas 80 annually so that an antenna surface is directed to a center of a ring, and holds the coupling antennas 80. The coupling antenna holding module 70 holds each coupling antenna 80 in a posture in which the coupling antenna 80 is inclined at, for example, 32 degrees with respect to a horizontal surface so that the respective coupling antennas 80 are able to radiate radio waves toward the same radiation point in upper positions, and is rotated by about 5 degrees around a center axis C1 in a direction orthogonal to a circumferential direction of the ring of the coupling antenna 80.

20 Claims, 28 Drawing Sheets

ELECTROMAGNETIC WAVE SHIELD BOX

TECHNICAL FIELD

The present invention relates to an electromagnetic wave shield box that accommodates a device under test having an antenna and a coupling antenna that is spatially coupled to the antenna such that electromagnetic waves from the outside can be shielded.

BACKGROUND ART

In recent years, with the development of multimedia, wireless terminals (smartphones or the like) in which antennas for wireless communication such as cellular and a wireless LAN are mounted have been actively produced. In the future, in particular, there is a demand for a wireless terminal that transmits and receives radio signals compatible with IEEE 802.11ad, 5G cellular, or the like in which broadband signals in a millimeter wave band are used.

In a manufacturing plant for a wireless terminal, a performance test in which an output level or reception sensitivity of transmission radio waves determined for each communication standard is measured and a determination is made whether or not a predetermined reference is satisfied is performed on a wireless communication antenna included in the wireless terminal.

In the related art, work for placing a radio terminal as a device under test (DUT) in an electromagnetic wave shield box one by one and connecting control terminals or antenna terminals of the DUT to a measurement device using a coaxial cable is performed when the performance test is performed.

As this type of electromagnetic wave shield box, there is an electromagnetic wave shield box that accommodates a wireless terminal in a state in which an antenna of the wireless terminal is spatially coupled to a coupling antenna for transmitting and receiving a radio signal (see, for example, Patent Document 1).

RELATED ART DOCUMENT

Patent Document

[Patent Document 1] JP-A-2004-80271

DISCLOSURE OF THE INVENTION

Problem that the Invention is to Solve

Incidentally, when performance test is performed on a wireless terminal using a radio signal in a so-called millimeter wave band of K and Ka bands (18 GHz to 40 GHz), such as 5 G cellular, which is a device under test (DUT), a connector that connects antenna terminals of the DUT to a test device is not supported in the first place in consideration of a transmission loss of a signal when a cable is used. Therefore, in this type of test, an electromagnetic wave shield box in which a so-called Over The Air (OTA) environment in which a coupling antenna is spatially coupled to the antenna of the DUT and a test signal is transmitted from the coupling antenna and received by the DUT is established is generally used.

Further, in the OTA test of the DUT described above, it is common to use a plurality of coupling antennas so that a sufficient test can be performed on high-speed communication capability of the DUT. However, in this type of OTA test of the DUT, radio waves radiated from the respective coupling antennas and, particularly, directly facing coupling antennas, or reflected waves of the radio waves by the DUT interfere with each other, which remain as standing waves, and accuracy of the performance test is likely to be degraded.

The electromagnetic wave shield box disclosed in Patent Document 1 is based on use of one coupling antenna and cannot be applied to a test of a DUT that is performed using a plurality of coupling antennas. Further, in the electromagnetic wave shield box disclosed in Patent Document 1, reduction of standing waves generated due to interference between radio waves transmitted from each coupling antenna or reflected waves thereof is not considered at all in an OTA test using a plurality of coupling antennas, which is performed on a DUT that uses a radio signal in a millimeter wave band.

Therefore, in an electromagnetic wave shield box of the related art represented by the electromagnetic wave shield box disclosed in Patent Document 1, in an OTA test of a device under test using a radio signal in a millimeter wave band, particularly, it is not possible to prevent generation of standing waves caused by radio signals transmitted from the directly facing coupling antennas, and accuracy of a performance test regarding whether or not communication of the device under test is normally performed or whether or not a communication protocol is correct is degraded.

The present invention has been made to solve such problems of the related art, and an object of the present invention is to provide an electromagnetic wave shield box capable of suppressing generation of standing waves caused by radio waves radiated from coupling antennas that are in a directly facing relationship and realizing an accurate performance test in a performance test under an OTA environment of a device under test using a radio signal in a millimeter wave band.

Means for Solving the Problem

In order to solve the problem, an electromagnetic wave shield box according to a first aspect of the present invention is an electromagnetic wave shield box (50) including a casing body portion (50a) in which a device under test (100) having an antenna (110) on one surface and performs communication using a radio signal in a millimeter wave band is able to be installed, and a coupling antenna (80) having a flat antenna surface and spatially coupled to the antenna, in the casing body portion, the electromagnetic wave shield box (50) shielding penetration of electromagnetic waves from the outside, the electromagnetic wave shield box including: a coupling antenna holding portion (70) that arranges a plurality of coupling antennas annularly so that the antenna surfaces are directed to a center side of a ring and holds the coupling antennas (80); a fixing portion (59) that fixes the coupling antenna holding portion to a bottom surface (51a) of the casing body portion; and a device-under-test holding portion (63) that horizontally holds the device under test so that the one surface is directed to the coupling antenna, at a position spaced from the coupling antenna above the coupling antenna, wherein the coupling antenna holding portion holds each coupling antenna in a posture in which the coupling antennas are inclined in the same way by a first angle with respect to a horizontal surface so that the coupling antennas are able to radiate radio waves to the device under test at the respective upper positions, a bottom angle of an isosceles triangle is set to the first angle, the ring is set to a bottom surface, a segment connecting an apex of a cone extending in the horizontal surface to a center of the coupling antenna is set to a rotation axis, and each coupling antenna is rotated by a second angle.

In order to solve the above problem, the electromagnetic wave shield box according to a second aspect of the present invention, wherein the casing body portion further includes a lid portion (50b) that has an upper surface as an opening and is supported by the casing body portion so that the opening is able to be opened and closed; and a radio wave absorber (55) pasted to inner surfaces of the casing body portion and the lid portion.

With this configuration, the electromagnetic wave shield box 50 according to the first aspect of the present invention can suppress generation of the standing waves (waves of which the waveform does not travel, stops on the spot, and appears to vibrate) by reflecting reflected waves from the DUT in a direction in which the waves do not interfere with each other according to the rotation angle of both the coupling antenna while enabling radiation at the same radiation point even when the coupling antennas in a directly facing positional relationship are disposed. Therefore, it is possible to suppress degradation of accuracy of the performance test caused by the standing waves. It is possible to easily perform an OTA test simply by fixing the device under test to the device-under-test holding portion. Further, since the radiation from the plurality of coupling antennas 80 is concentrated at the radiation point, it is possible to perform a mobility test and a carrier aggregation (CA) test in which communication is simultaneously performed using a plurality of LTE carriers.

In order to solve the above problem, in an electromagnetic wave shield box according to a third aspect of the present invention, the coupling antenna holding portion holds each coupling antenna so that a predetermined height position in a direction perpendicular to the antenna surface from a center of the antenna surface becomes an apex of an isosceles triangle having an angle twice the first angle as an apex angle and a diameter of the ring passing through a center of the coupling antenna as a bottom side, and the device-under-test holding portion holds the device under test so that the one surface is at a height position corresponding to an apex of an isosceles triangle having an angle twice the first angle as an apex angle and a diameter of the ring passing through a center of the coupling antenna as a bottom side.

With this configuration, in the electromagnetic wave shield box according to the third aspect of the present invention, the radiation point of each coupling antenna can be easily recognized on the basis of an angle of each coupling antenna and a height from a center of each coupling antenna to the radiation point defined in advance, and work of setting the device under test under consideration of the radiation point and an antenna mounting place of the device under test is facilitated.

In order to solve the above problem, in an electromagnetic wave shield box according to a fourth aspect of the present invention, the coupling antenna holding portion is fixed at a predetermined position on the bottom surface so that the apex of the isosceles triangle is determined in a region corresponding to an antenna mounting region on the one surface of the device under test.

With this configuration, the electromagnetic wave shield box according to the fourth aspect of the present invention can determine the radiation point in the region corresponding to the antenna mounting region of the device under test and reliably radiate test signals from each coupling antenna, and effects of suppressing degradation of test performance is enhanced as compared with a case in which test signals are radiated to a position away from the above region.

In order to solve the above problem, in an electromagnetic wave shield box according to a fifth aspect of the present invention, the coupling antenna holding portion is constituted by an assembly of an antenna attachment stand (72) having two antenna attachment surfaces ($72c1$, $72c2$), and a pedestal portion (71) having two stand attachment surfaces ($71c1$, $71c2$), the coupling antenna is able to be attached to at least one of the two antenna attachment surfaces in the antenna attachment stand, and the antenna attachment stand to which the coupling antenna has been attached is able to be attached to at least one of the two stand attachment surfaces in the pedestal portion.

With this configuration, in the electromagnetic wave shield box according to the fifth aspect of the present invention, one or two antenna attachment stands can be attached onto the pedestal portion, or two pedestal portions can be attached at different places. A user can select a desired configuration and perform a performance test without waste of the device under test. Further, a performance test of the device under test having a plurality of coupling antennas can be performed through the division arrangement of the pedestal portions.

In order to solve the above problem, in an electromagnetic wave shield box according to a sixth aspect of the present invention, in the antenna attachment stand, the two antenna attachment surfaces are formed so that the two coupling antennas are able to be attached to the two antenna attachment surfaces at angles of 45 degrees in a circumferential direction of the ring, and in the pedestal portion, the two stand attachment surfaces are formed so that the two antenna attachment stands are able to be attached to the two stand attachment surfaces at angles of 90 degrees in the circumferential direction of the ring.

With this configuration, in the electromagnetic wave shield box according to the sixth aspect of the present invention, a maximum of four coupling antennas can be attached onto one pedestal portion, and a system configuration desired by the user can be easily constructed.

In order to solve the above problem, in an electromagnetic wave shield box according to a seventh aspect of the present invention, the pedestal portion is configured as block members obtained by dividing a plate member having a regular n-gon shape having n or more sides in two to be bilaterally symmetrical with a straight line connecting respective middle points of one side of the regular n-gon shape and a facing side facing the one side.

With this configuration, the electromagnetic wave shield box according to the seventh aspect of the present invention can be assembled in a regular octagonal shape by causing the two pedestal portions, that is, a portion corresponding to one side of a polygon and a portion corresponding to a facing side to face each other, and a maximum of n coupling antennas can be disposed annularly. In this case, it is possible to prevent generation of standing waves for each of the coupling antennas disposed at the positions directly facing each other.

In order to solve the above problem, in an electromagnetic wave shield box according to an eighth aspect of the present invention, the fixing portion includes a plurality of columnar mount members (60) that are erected on the bottom surface and provided at predetermined installation intervals in vertical and horizontal directions, and the pedestal portion includes two insertion holes ($71d1$, $71d2$) that are provided at intervals corresponding to the installation intervals of the mount members and into which the mount members are inserted detachably.

With this configuration, in the electromagnetic wave shield box according to the eighth aspect of the present invention, the two mount members at any positions are inserted into the two mount insertion holes of the pedestal portion, respectively. Therefore, the pedestal portion and the coupling antenna can be disposed at a position corresponding to the mount member on the bottom surface of the casing body portion, and the disposition change becomes easy. When position adjustment of the pedestal portion is necessary according to the antenna formation surface of the device under test, the radiation from each coupling antenna is concentrated on the radiation point along a vertical direction of the antenna attachment stand. Therefore, the position adjustment can be easily performed.

In order to solve the above problem, in an electromagnetic wave shield box according to a ninth aspect of the present invention, the device-under-test holding portion is configured as a transparent member having radio wave transparency or an opaque member in which an opening window penetrating in a thickness direction is formed in a portion of a holding surface holding the device under test.

With this configuration, in the electromagnetic wave shield box according to the ninth aspect of the present invention, since the annular disposition of the coupling antennas can be visually recognized, it is possible to easily recognize the radiation point, and to easily and accurately perform setting work for the device under test for aligning the antenna formation surface of the device under test with the radiation point.

In order to solve the above problem, an electromagnetic wave shield box according to a tenth aspect of the present invention further includes a connection portion cover (75) that covers the connection portion (77) that electrically connects, via a metal connector (73), the coupling antenna to the feed line (74) that supplies a test signal of the device under test, from an upper side below the coupling antenna.

With this configuration, the electromagnetic wave shield box according to the tenth aspect of the present invention can regulate radiation of reflected waves to the connection portion by the device under test from each coupling antenna with respect to the connection portion by the connection portion cover, and can suppress degradation of accuracy of a performance test.

In order to solve the above problem, in an electromagnetic wave shield box according to an eleventh aspect of the present invention, the coupling antenna is a circular polarization antenna (20), and a set of circular polarization antennas of two types including right hand circular polarization and left hand circular polarization are attached to the antenna attachment stand.

With this configuration, the electromagnetic wave shield box according to the eleventh aspect of the present invention can receive radio waves transmitted from a set of two types of circular polarization antennas using the antenna of the device under test and separate the radio waves into two. Accordingly, it is possible to execute a polarization multiple input multiple output (MIMO) test using planar spiral antennas of right hand circular polarization and left hand circular polarization.

In order to solve the above problem, in an electromagnetic wave shield box according to a twelfth aspect of the present invention, the circular polarization antenna includes a dielectric substrate (21); a ground plate conductor (22) that is superimposed on one surface (21a) of the dielectric substrate; a circular polarization antenna element (23) formed on an opposite surface (21b) of the dielectric substrate facing one surface of the device under test; a plurality of metal posts (30) that has one end side connected to the ground plate conductor, each of the metal posts penetrating the dielectric substrate in a thickness direction thereof, and the other end side of each of the metal posts (30) extending to the opposite surface of the dielectric substrate, the metal posts being provided at predetermined intervals to surround the antenna element and constitute a cavity; and a frame-shaped conductor (32) in which a rim short-circuiting the other end sides of the plurality of metal posts in an arrangement direction thereof and having a predetermined width in an antenna element direction is provided on an opposite surface side of the dielectric substrate, wherein the cavity and the frame-shaped conductor constitute a resonator, structural parameters of the resonator and the antenna element are adjusted to set a resonance frequency of the resonator to a desired value, the structural parameters include at least one of an inner dimension Lw of the cavity, a rim width LR of the frame-shaped conductor, the number of turns of the antenna element, a basic length a0 of the antenna element, and an element width W of the antenna element, and the rim width LR of the frame-shaped conductor is a width of approximately ¼ of a wavelength of surface waves propagating along a surface of the dielectric substrate.

With this configuration, the electromagnetic wave shield box according to the twelfth aspect of the present invention can suppress an amplitude error caused by the multiple reflections of the signal under measurement between the antenna of the device under test and the circular polarization antenna, and improve performance test accuracy for the device under test.

Advantage of the Invention

The present invention can provide an electromagnetic wave shield box capable of suppressing generation of standing waves caused by radio waves radiated from coupling antennas that are in a directly facing relationship and realizing an accurate performance test in a performance test under an OTA environment of a device under test using a radio signal in a millimeter wave band.

BEST MODE FOR CARRYING OUT THE INVENTION

Hereinafter, an embodiment of an electromagnetic wave shield box according to the present invention and a wireless terminal measurement device using the same will be described with reference to the drawings.

Figure 1:
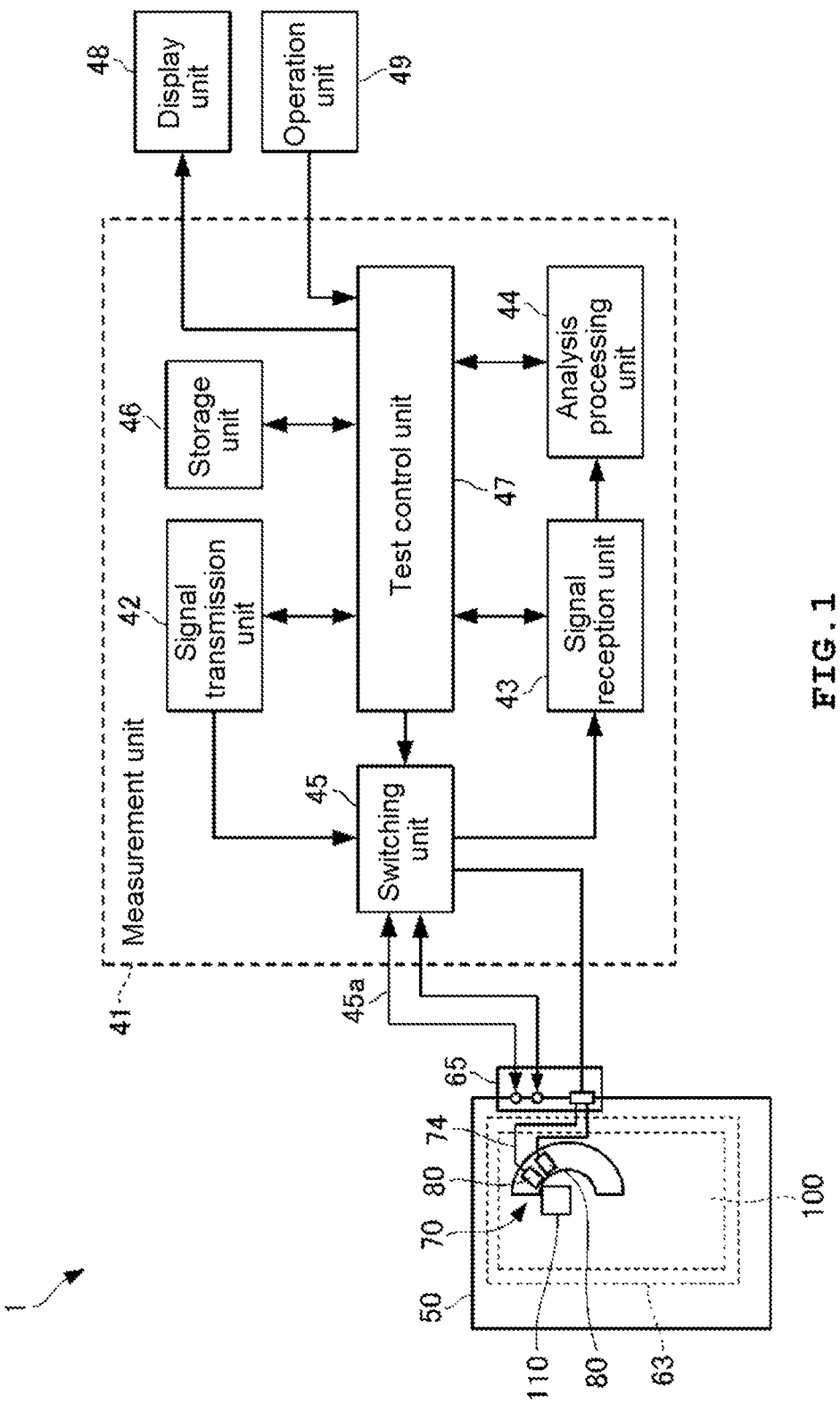
FIG. 1 is a block diagram illustration a configuration of wireless terminal measurement device to which an electromagnetic wave shield box according to an embodiment of the present invention is applied.

As illustrated in FIG. 1, a wireless terminal measurement device 1 according to an embodiment of the present invention inputs a test signal to a DUT 100 having one or more antennas 110, and performs measurements (test) of transmission and reception properties on a measured signal output from the DUT 100. For example, the wireless terminal measurement device 1 includes a measurement unit 41, a display unit 48, a manipulation unit 49, and an electromagnetic wave shield box 50.

The DUT 100 is, for example, a wireless terminal such as a smartphone. Examples of a communication standard for the DUT 100 include cellular (LTE, LTE-A, W-CDMA (registered trademark), GSM (registered trademark), CDMA2000, 1×EV-DO, TD-SCDMA, and the like), wireless LAN (IEEE 802.11b/g/a/n/ac/ad and the like), Bluetooth (registered trademark), GNSS (GPS, Galileo, GLONASS, BeiDou, and the like), FM, and digital broadcasting (DVB-H, ISDB-T, and the like). Further, the DUT 100 may also be a wireless terminal that transmits and receives a radio signal in a millimeter wave band compatible with IEEE 802.11ad, 5G cellular, and the like.

In FIG. 1, the electromagnetic wave shield box 50 accommodates the DUT 100 having the antenna 110 and the plurality of coupling antennas 80 inside a box (an inside space) is a state in which penetration of electromagnetic waves from the outside into the inside space is shielded (shielded), and provides an OTA test environment according to spatial coupling of the antenna 110 of the DUT 100 and the plurality of coupling antennas 80.

As illustrated in FIG. 1, the measurement unit 41 includes a signal transmission unit 42, a signal reception unit 43, an analysis processing unit 44, a switching unit 45, a storage unit 46, and a test control unit 47. The measurement unit 41 performs measurement regarding an output level of transmission radio waves, reception sensitivity, and the like on the DUT 100.

The signal transmission unit 42 outputs a test signal to the DUT 100 housed in the electromagnetic wave shield box 50 via a coupling antenna 80, and the antenna 110 of the DUT 100.

The signal reception unit 43 receives a signal under measurement output from the DUT 100 to which a test signal has been input, via the antenna 110 of the DUT 100 and the coupling antenna 80.

The analysis processing unit 44 performs an analysis process compatible with a communication standard of the DUT 100 on the signal under measurement received by the signal reception unit 43. A specific example of the analysis process that is performed by the analysis processing unit 44 includes measurement of modulation accuracy (EVM), transmission power level, transmission spectrum mask, error vector amplitude, minimum input sensitivity, maximum input level, adjacent channel leakage power, and spurious emission measurement.

The test signal includes a control signal for performing various controls compatible with the communication standard of the DUT 100, such as setting the DUT 100 to a call connection state with respect to the wireless terminal measurement device 1 of the embodiment. Further, the signal under measurement is a response signal from the DUT 100 with respect to the test signal output from the wireless terminal measurement device 1 of the embodiment, or a transmission signal that is output from the DUT 100 regardless of the test signal.

The switching unit 45 is a wideband directional coupler that passes an output frequency of the test signal output from the signal transmission unit 42, and is configured as, for example, a Wilkinson-type distributor. As illustrated in FIG. 1, the switching unit 45 is connected to a USB box 65 (see FIGS. 5A and 5B) provided in the electromagnetic wave shield box 50 by a coaxial cable 45*a*, and is connected to a feed line 74 (see FIGS. 7A and 7B) that, for example, supplies power to the coupling antenna 80. The USB box 65 connects the coaxial cable 45*a* to the DUT 100 accommodated in the electromagnetic wave shield box 50 in a USB manner. Thus, the switching unit 45 can input the test signal output from the signal transmission unit 42 to the coupling antenna 80 through the feed line 74 and also input the test signal from the DUT 100 received by the antenna 110, to the signal reception unit 43.

The test control unit 47 is configured as, for example, a microcomputer or a personal computer including a CPU, and a ROM, a RAM, or an HDD constituting the storage unit 46, and controls an operation of each unit constituting the measurement unit 41.

The signal transmission unit 42, the signal reception unit 43, and the analysis processing unit 44 can be configured as a digital circuit such as an FPGA (Field Programmable Gate Array) or an ASIC (Application Specific Integrated Circuit), or can be configured in software by a predetermined program stored in the storage unit 46 in advance being executed by the test control unit 47. Alternatively, the signal transmission unit 42, the signal reception unit 43, and the analysis processing unit 44 can be configured by appropriately combining hardware processing using a digital circuit with software processing using a predetermined program. The test control unit 47 can also receive a new program or a program of which the version has been changed from the outside, and perform addition of the program to the storage unit 46 or update.

The display unit 48 includes, for example, a display device such as an LCD or a CRT, and displays measurement results, or manipulation targets such as softkeys, pull-down menus, or text boxes for setting measurement conditions and the like on the basis of a control signal from the test control unit 47.

The manipulation unit 49 performs a manipulation input by the user, and is configured as, for example, a touch panel provided on a surface of a display screen of the display unit 48. Alternatively, the manipulation unit 49 may include an input device such as a keyboard or a mouse. Further, the manipulation unit 49 may be configured as an external control device that performs remote control by a remote command or the like. An input manipulation by the manipulation unit 49 is detected by the test control unit 47. The user can select a communication standard supported by the DUT 100 from among a plurality of communication standards using the manipulation unit 49.

Figure 2A:
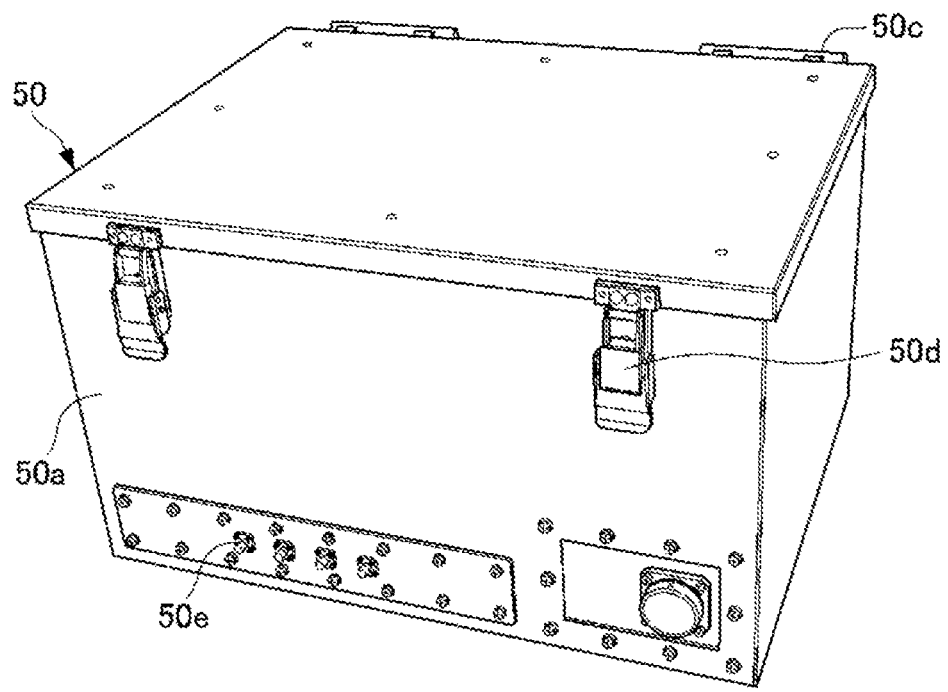
FIGS. 2A and 2B are a front and a rear view respectively illustrating an appearance structure of the electromagnetic wave shield box according to the embodiment of the present invention.
Figure 2B:
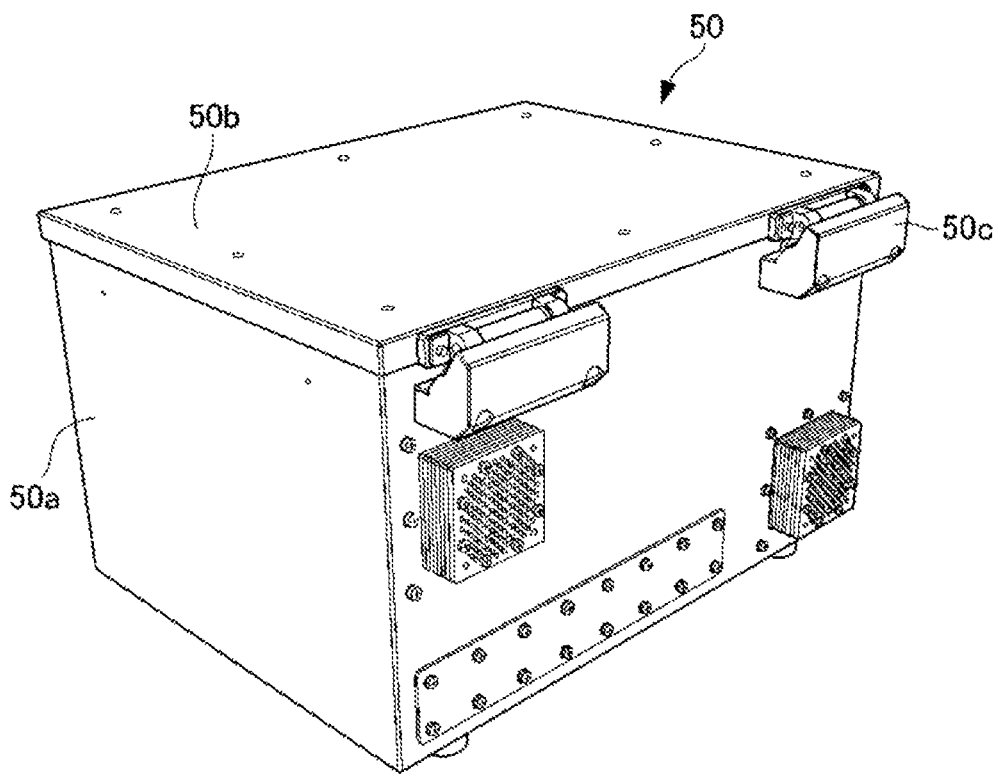

Next, a configuration of the electromagnetic wave shield box 50 will be described. FIGS. 2A and 2B are a front and a rear view respectively illustrating an appearance structure of the electromagnetic wave shield box 50 according to the embodiment of the present invention, and FIG. 2A is a perspective view when viewed from the front side, and FIG. 2B is a perspective view when viewed from the back side. As illustrated in FIGS. 2A and 2B, the electromagnetic wave shield box 50 has a rectangular parallelepiped shape with one open surface, and includes a casing body portion 50*a* having an internal space (see FIGS. 3 and 4), and a lid portion 50*b* that is supported by the casing body portion 50*a* via hinge portions 50*c* and is capable of opening and closing an opening. A fastener 50*d* that fastens the closed lid portion 50*b* so that the closed lid portion 50*b* is not opened is provided on an outer side surface of the casing body portion 50*a*. The casing body portion 50*a* and the lid portion 50*b* are made of, for example, a conductive metal such as iron, stainless steel, aluminum, copper, brass, or an alloy of these.

Figure 3:
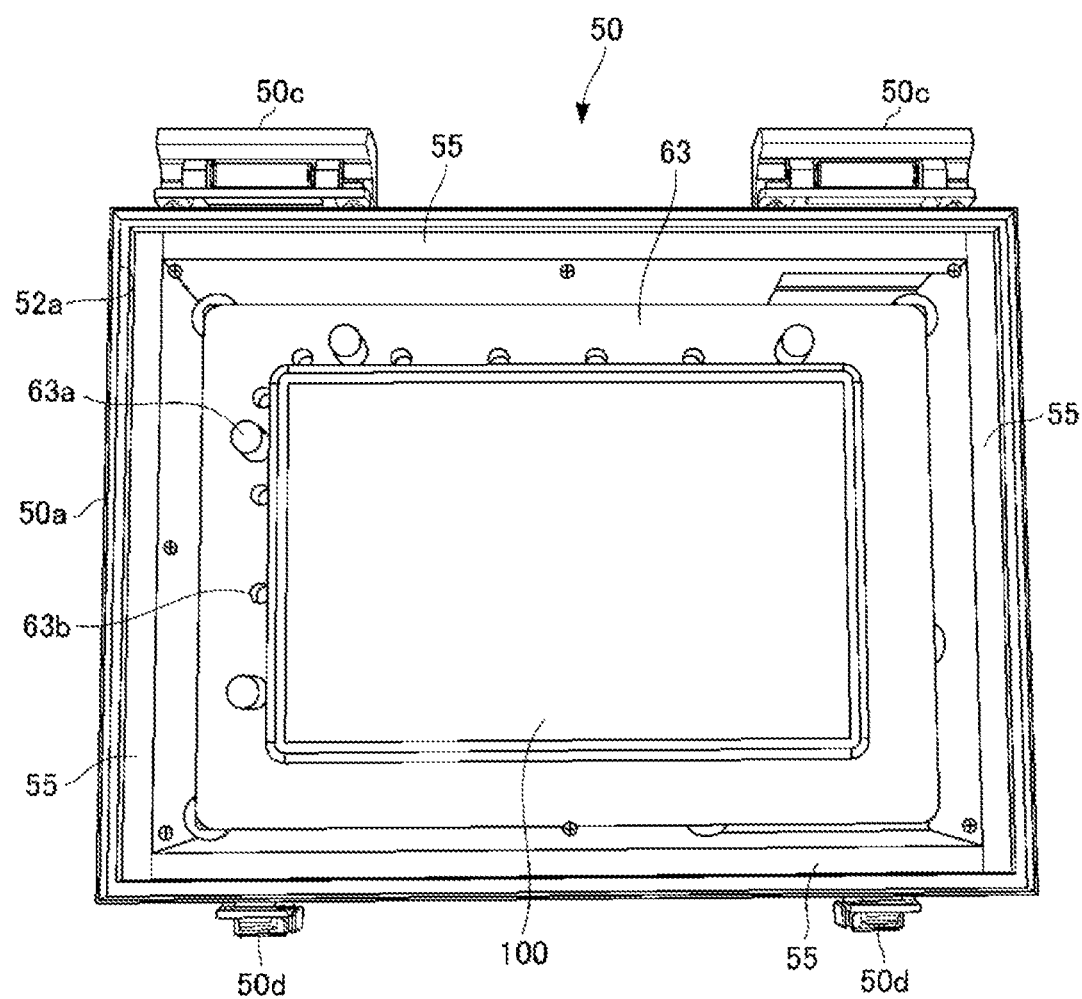
FIG. 3 is a view illustrating a structure when viewed from above in a state in which there is no lid portion of the electromagnetic wave shield box according to the embodiment of the present invention.
Figure 4:
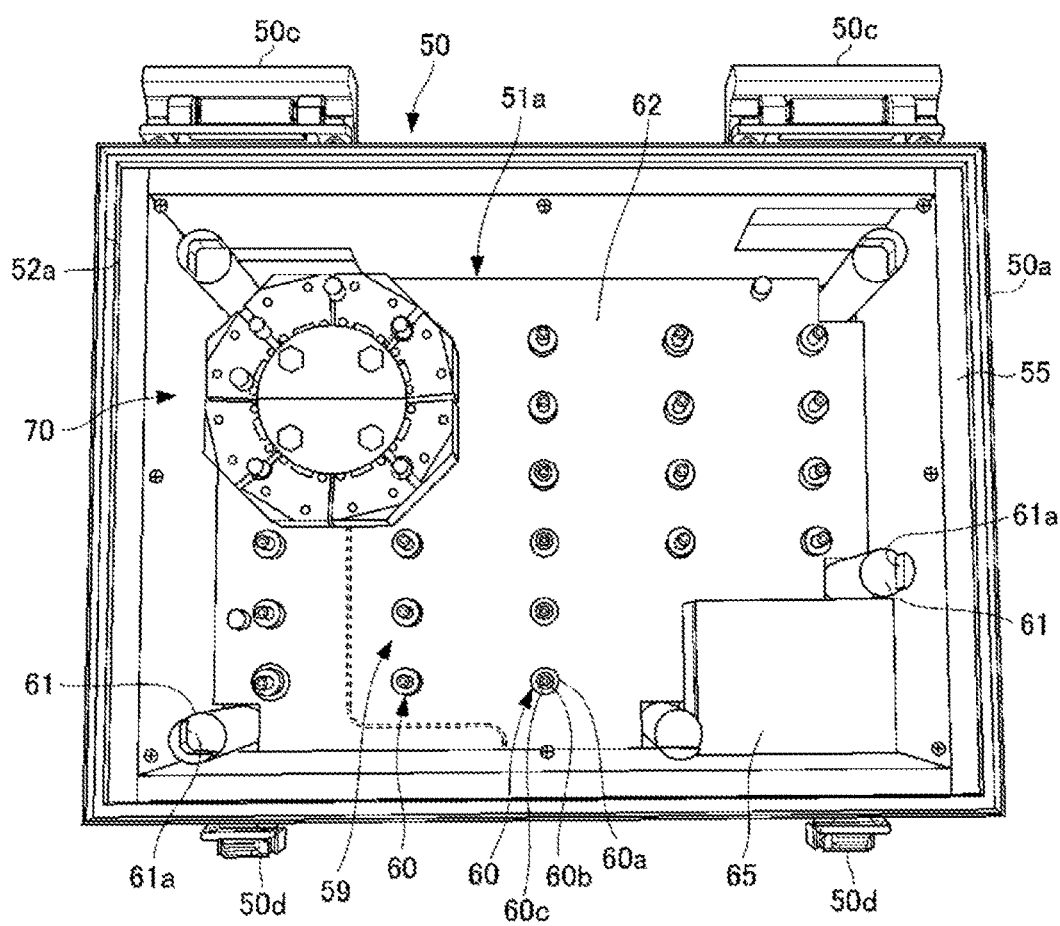
FIG. 4 is a diagram illustrating a structure when the electromagnetic wave shield box is viewed from above after a DUT holding portion is detached in FIG. 3.

FIG. 3 illustrates a structure when viewed from above in a state in which there is no lid portion 50*b* of the electromagnetic wave shield box 50, and FIG. 4 illustrates a structure when the electromagnetic wave shield box 50 is viewed from above after a DUT holding portion 63 is detached in FIG. 3. Further, FIGS. 5A and 5B are partial cross-sectional views illustrating a mounting aspect of shield members 56 and 57 in the casing body portion 50*a* and the lid portion 50*b* of the electromagnetic wave shield box 50.

As illustrated in FIGS. 3 to 5, in the electromagnetic wave shield box 50, a radio wave absorber 55 is pasted to inner surfaces, that is, a bottom surface 51*a* and a side wall surface 52*a* of the casing body portion 50*a* and an inner surface 52*b* of the lid portion 50*b*. The radio wave absorber 55 absorbs electromagnetic waves generated by the antenna 110 or the coupling antenna 80 of the DUT 100 in a state in which the lid portion 50*b* is closed, and prevents leakage of the electromagnetic waves g to the outside.

Figure 5A:
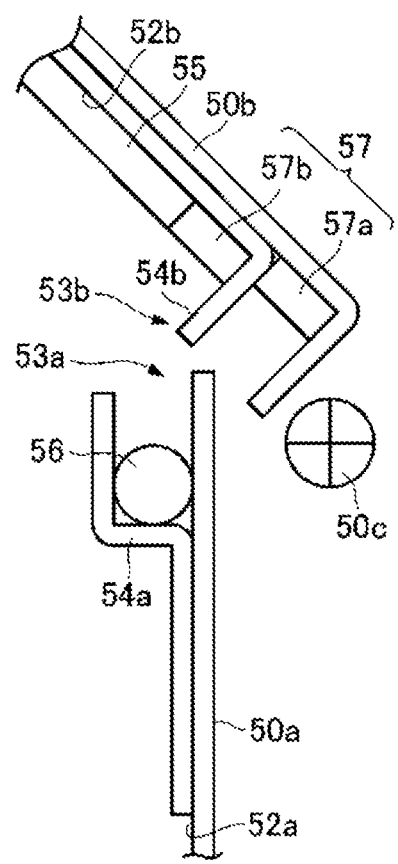
FIGS. 5A and 5B are partial cross-sectional views illustrating a mounting aspect of a radio wave absorber in the electromagnetic wave shield box and a lid portion according to the embodiment of the present invention.
Figure 5B:
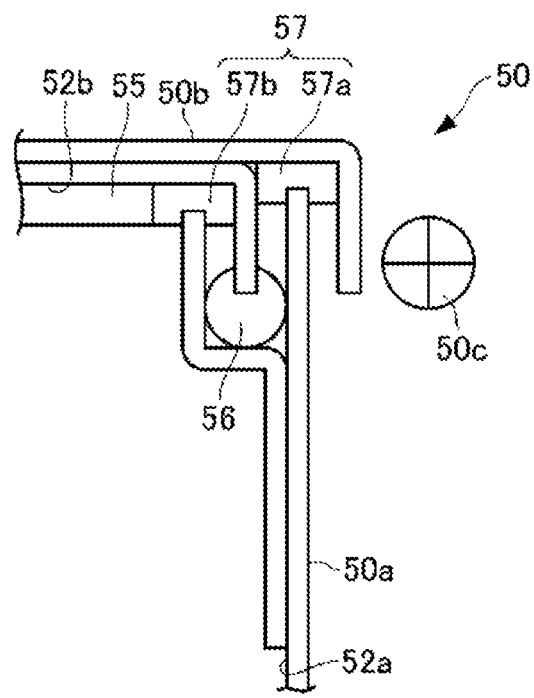

Further, in the electromagnetic wave shield box 50, shield members 56 and 57 (57*a* and 57*b*) are attached to an opening end 53*a* of the casing body portion 50*a* and an opening end 53*b* of the lid portion 50*b*, respectively, as illustrated in FIGS. 5A and 5B. Specifically, a plate member 54*a* is provided at the opening end 53*a* of the casing body portion 50*a* to face the side wall surface 52*a*, and the shield member is attached in a groove portion between the side wall surface 52*a* and the plate member 54*a* to surround the opening end 53*a*. On the other hand, the plate member 54*b* having a bent portion facing a bent portion that is at an outer peripheral end of the lid portion 50*b* is provided at the opening end 53*b* of the lid portion 50b, and the shield members 57a and 57b are attached in a groove portion between both the bent portions to surround the opening end 53b. The shield members 56, 57a, and 57b are directed to outward as illustrated in FIG. 5A when the lid portion 50b is opened, whereas when the lid portion 50b is closed, the shield members 56, 57a, and 57b are interposed between the opening end 53a of the casing body portion 50a and the opening end 53b of the lid portion 50b at a position at which the opening end 53a of the casing body portion 50a is covered with the opening end 53b of the lid portion 50b, and penetration of electromagnetic waves from the outside to the inside of the box is shielded, as illustrated in FIG. 5B.

Further, in the electromagnetic wave shield box 50, a plurality of mount members 60 and a DUT holding portion installation member 61 are provided on the bottom surface 51a of the casing body portion 50a, as illustrated in FIG. 4. The electromagnetic wave shield box 50 also includes a lower partition plate 62 through which the mount member 60 passes and which is disposed horizontally with respect to the bottom surface 51a of the casing body portion 50a. The mount members 60 are cylindrical members made of resin. The plurality of mount members 60 are disposed at predetermined installation intervals in vertical and horizontal directions in an area other than an installation prohibition region of the bottom surface 51a of the casing body portion 50a, and are erected in a vertical direction with respect to the bottom surface 51a. The USB box 65 is provided on the bottom surface 51a of the casing body portion 50a. An area in which the USB box 65 is provided is an installation prohibition region of the mount member 60 and the DUT holding portion installation member 61.

The mount member 60 has a function of a fixing portion 59 for fixing (mounting) a coupling antenna holding module 70 at a desired position on the bottom surface 51a of the casing body portion 50a. The mount member 60 includes a base portion 60a having a fixed length fixed to the bottom surface 51a, and a cylindrical portion 60b extending from the base portion 60a to the other end. The base portion 60a has a diameter larger than that of the cylindrical portion 60b, and an annular end surface 60c having a diameter larger than that of the cylindrical portion 60b is formed at a position of a boundary with the cylindrical portion 60b. The annular end surface 60c functions as a pedestal portion acceptance portion that accepts the pedestal portion 71 (see FIG. 16) that constitutes the coupling antenna holding module 70. A tap hole having a certain length in a length direction from an upper end portion is formed in the cylindrical portion 60b. The tap hole is formed in a shape that can screw a screw thread of a thumb screw 85 (see FIG. 16) to be described below.

The DUT holding portion installation member 61 is a columnar member made of resin, and holds the DUT holding portion 63 that holds the DUT 100 (on which the DUT 100 is placed) at the time of an OTA test. Five DUT holding portion installation members 61 are provided at places other than one corner corresponding to the installation prohibition region described above among the four corners of the internal space of the casing body portion 50a, and places of two corners formed between the places and the USB box 65 provided in the installation prohibition region. A notch 61a that receives the DUT holding portion 63 so that the DUT holding portion 63 is maintained in a horizontal state and in a state in which a horizontal movement is regulated is formed at an upper end portion of the DUT holding portion installation member 61.

The lower partition plate 62 is disposed to cover the bottom surface 51a of the casing body portion 50a, and serves to attenuate a test signal reflected by a surface (an antenna formation surface) corresponding to the antenna mounting region of the DUT 100 held by the DUT holding portion installation member 61 at the time of an OTA test of the DUT 100.

As illustrated in FIG. 3, the DUT holding portion 63 holds the DUT 100 in a horizontal state so that a surface (an antenna formation surface) on which the antenna 110 of the DUT 100 is formed is directed to the coupling antenna 80 held by the coupling antenna holding module 70, at a position spaced apart from each coupling antenna 80 above the coupling antenna 80. The DUT holding portion 63 is formed of a tray-shaped member having a flat surface, and a plurality of regulation members 63a that regulate a motion in a horizontal direction of the placed DUT 100 are attached to a plurality of places on the flat surface so that positions of the regulation members can be changed. A screw, for example, is formed in a lower portion of the regulation member 63a, and is screwed into a screw hole 63b provided at a predetermined pitch in the flat surface of the DUT holding portion 63, such that the regulation member 63a can be fixed. The DUT holding portion 63 constitutes a device-under-test holding portion in the present invention.

The DUT holding portion 63 may be constituted by a transparent member having radio wave transparency. Further, the DUT holding portion 63 may be constituted by an opaque member in which an opening window penetrating in a thickness direction is formed in a portion of a holding surface (a flat surface) holding the DUT 100. The DUT holding portion 63 constitutes a device-under-test holding portion in the present invention.

Further, the electromagnetic wave shield box 50 includes the coupling antenna holding module 70 that can be fixed by the mount member 60 at a position above the lower partition plate 62 in the internal space of the casing body portion 50a, as illustrated in FIG. 3 and FIG. 4. The coupling antenna holding module 70 constitutes a coupling antenna holding portion of the present invention.

Figure 15:
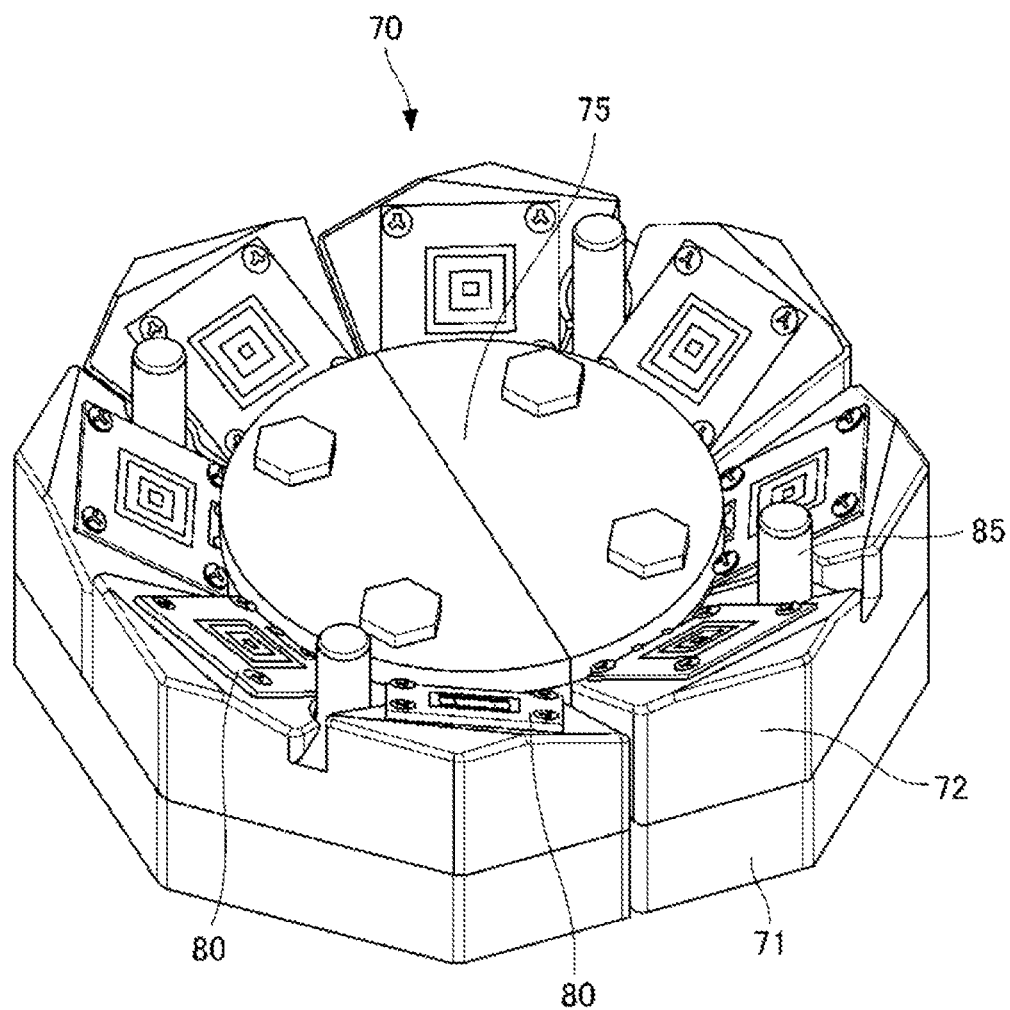
FIG. 15 is a perspective view illustrating an entire structure of the coupling antenna holding module in the electromagnetic wave shield box according to the embodiment of the present invention.

FIG. 15 is a perspective view illustrating a configuration of the coupling antenna holding module 70 in FIG. 4. In the coupling antenna holding module 70, a plurality of coupling antennas 80 are disposed annularly to be directed to the center side of the ring and held. A circular polarization antenna, for example, can be used as the coupling antenna 80 held by the coupling antenna holding module 70.

Here, a configuration of a circular polarization antenna 20 will first be described with reference to FIGS. 6 to 14. FIGS. 4 to 10 illustrate a basic structure of the circular polarization antenna 20.

Figure 6:
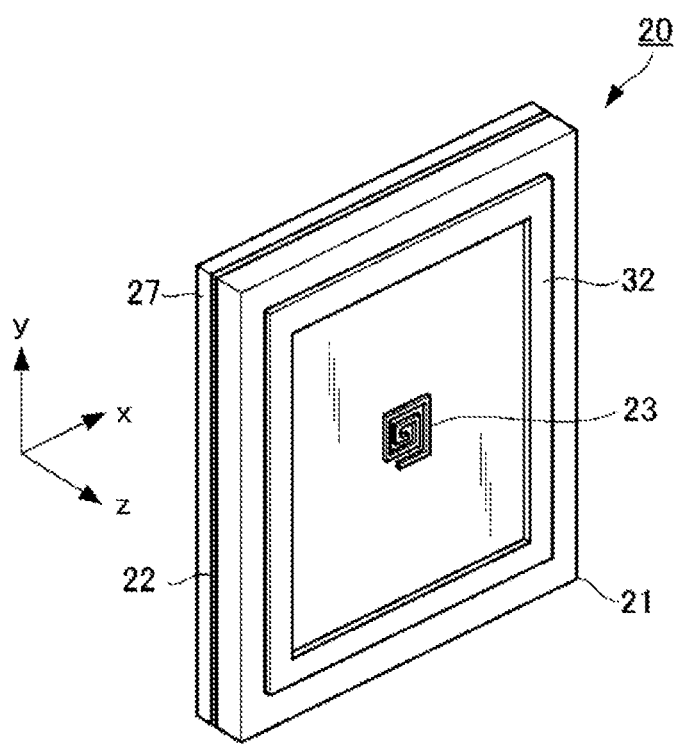
FIG. 6 is a perspective view of a configuration of a circular polarization antenna held by a coupling antenna holding module of the electromagnetic wave shield box according to the embodiment of the present invention.
Figure 7A:
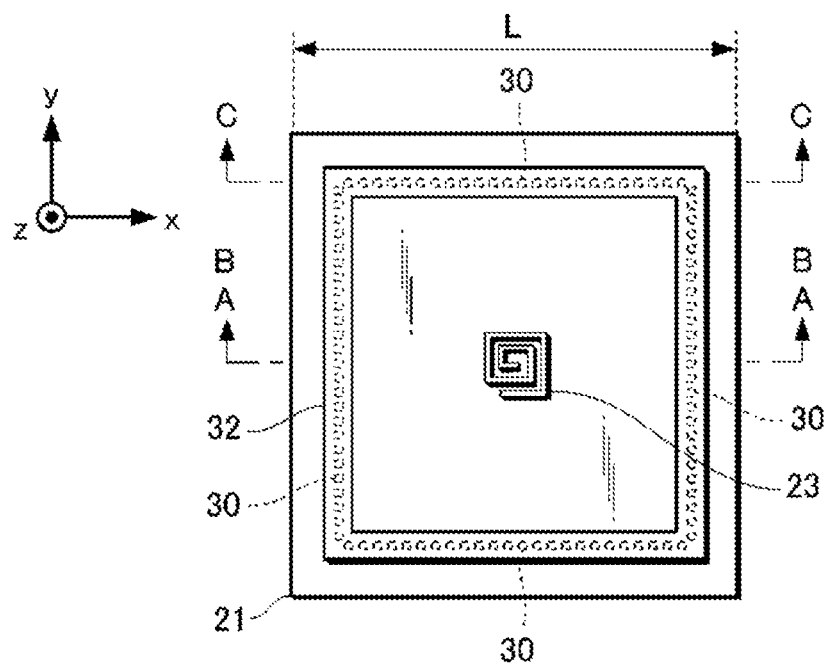
FIG. 7A is a front view of a configuration of an LHCP of a circular polarization antenna in the embodiment of the present invention.
Figure 7B:
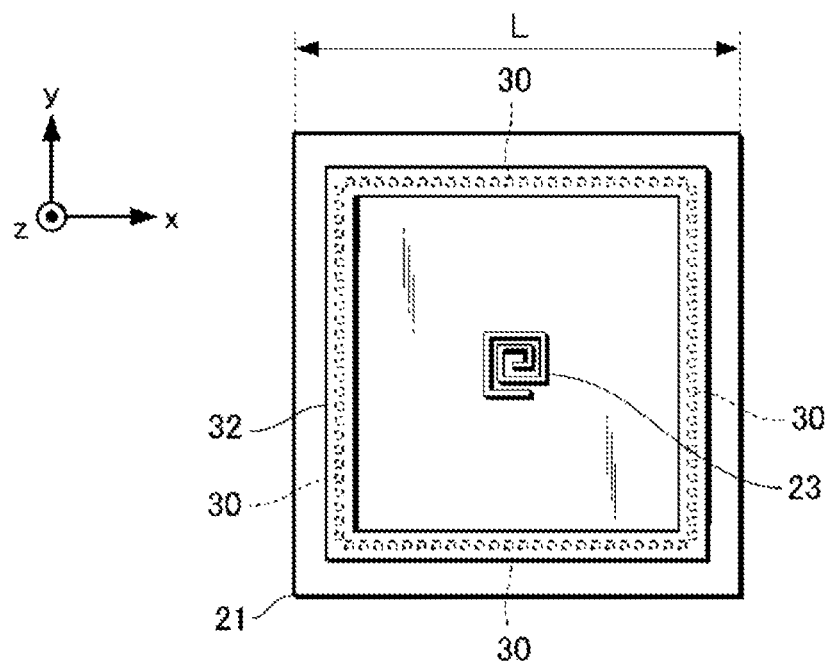
FIG. 7B is a front view of a configuration of an RHCP of a circular polarization antenna in the embodiment of the present invention.
Figure 8:
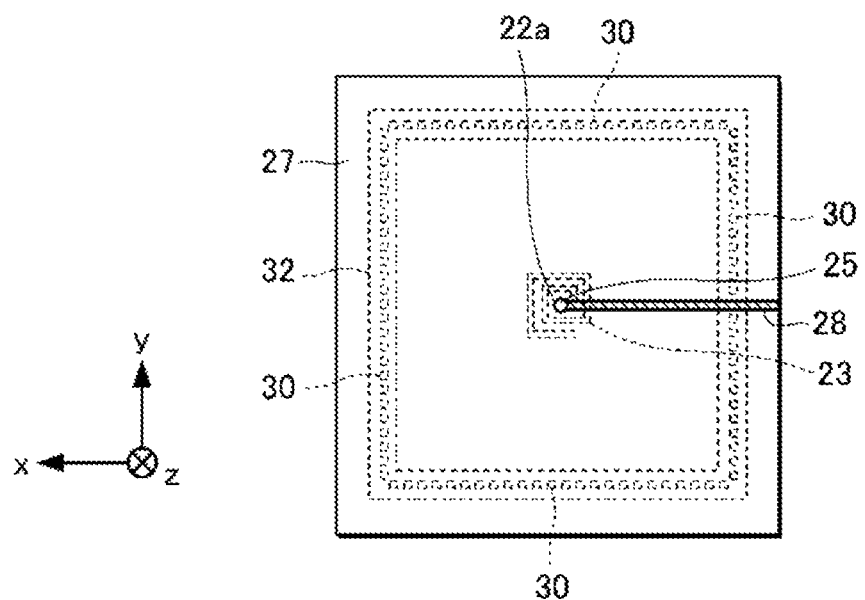
FIG. 8 is a rear view illustrating the configuration of the circular polarization antenna according to the embodiment of the present invention.
Figure 9A:
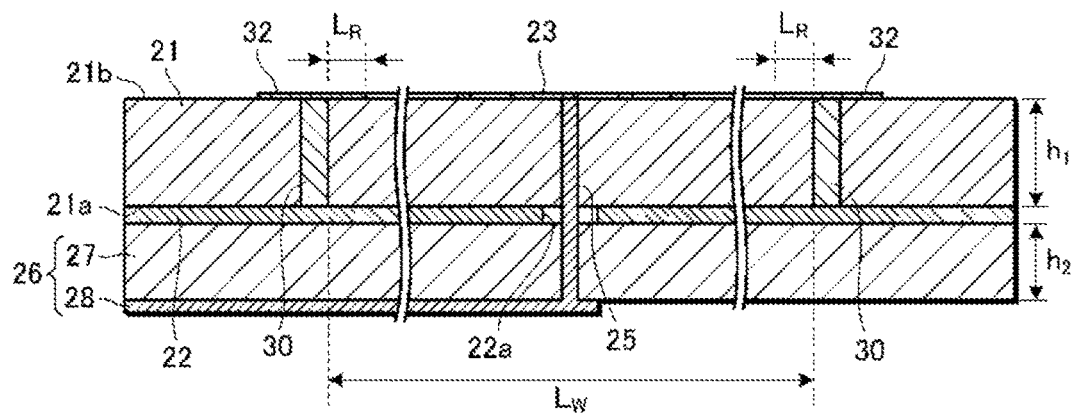
FIG. 9A is an enlarged cross-sectional view taken along a line A-A of FIG. 7A.
Figure 9B:
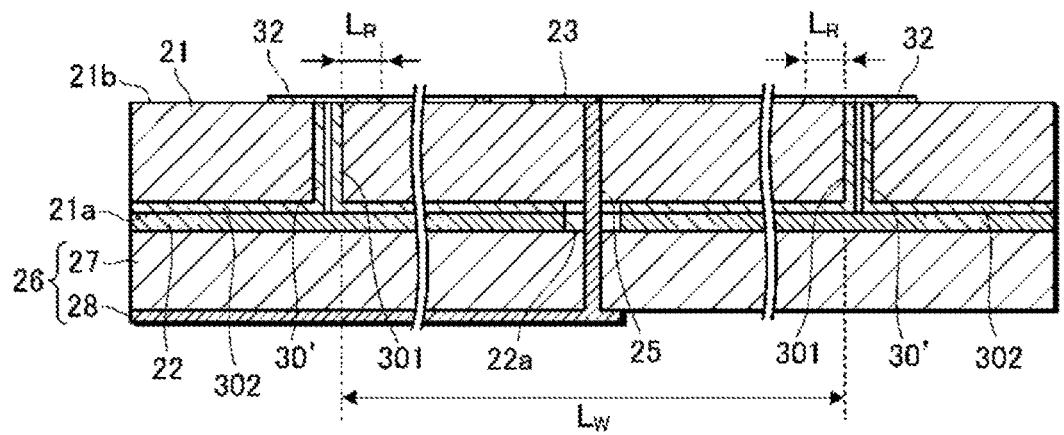
FIG. 9B is an enlarged cross-sectional view taken along a line B-B in a modification example in FIG. 7A.
Figure 10:
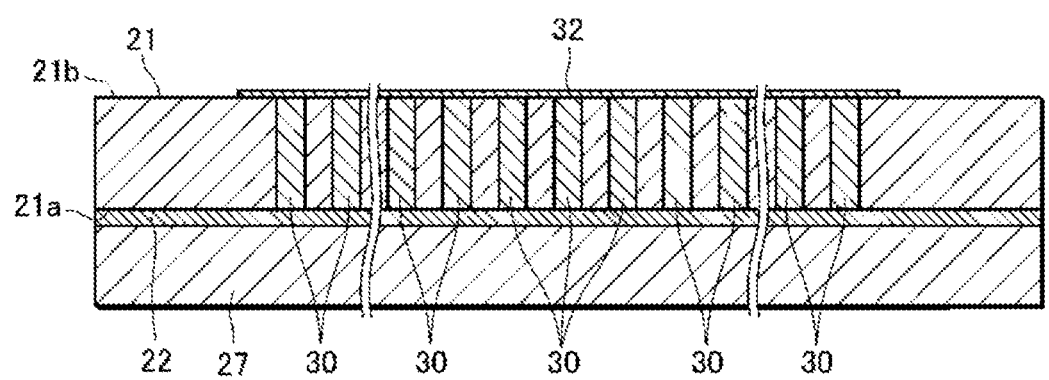
FIG. 10 is an enlarged cross-sectional view taken along a line C-C in FIG. 7A.

That is, FIG. 6 is a perspective view illustrated to describe the configuration of the circular polarization antenna 20. Further, FIGS. 7A and 7B are front views illustrated to describe the configuration of the circular polarization antenna 20. Further, FIG. 8 is a rear view illustrated to describe the configuration of the circular polarization antenna 20. Further, FIG. 9A is an enlarged cross-sectional view taken along a line A-A of FIG. 7A. FIG. 9B is an enlarged cross-sectional view taken along a line B-B in the modification of FIG. 7A. Further, FIG. 10 is an enlarged cross-sectional view taken along a line C-C of FIG. 7A.

The circular polarization antenna 20 according to the embodiment, basically, includes a dielectric substrate 21, a ground plate conductor 22 superimposed on one surface 21a of the dielectric substrate 21, and a circular polarization antenna element 23 formed on an opposite surface 21*b* of the dielectric substrate 21, as illustrated in FIGS. 6 to 10.

Further, a feed portion 26 for feeding an excitation signal to the antenna element 23 is formed on the opposite side of the dielectric substrate 21 with the ground plate conductor 22 interposed therebetween. The feed portion 26 has a feed dielectric substrate 27, and a feed line 28 of a microstrip line formed on a surface of the feed dielectric substrate 27 opposite to the ground plate conductor 22 and using the ground plate conductor 22 as the ground.

A material such as R04003 (Rogers) with low loss in a quasi-millimeter wave band can be used as the dielectric substrate 21 and the feed dielectric substrate 27 described above.

Any material having a low loss and a dielectric constant of about 2 to 5 can be used as a material of the dielectric substrate 21 and the feed dielectric substrate 27. For example, a glass cloth Teflon substrate or various thermosetting resin substrates can be candidates. For example, in the configuration illustrated in FIG. 9A, a dielectric constant of each of the dielectric substrate 21 and the feed dielectric substrate 27 can be set to 3.62, a height h1 of the dielectric substrate 21 can be set to 1.1 mm, and a height h2 of the feed dielectric substrate 27 can be set to 0.3 mm or the like.

The antenna element 23 is an unbalanced antenna, for example, a right hand rectangular spiral (see FIG. 7A) or a left hand rectangular spiral (see FIG. 7B) formed on the side of the opposite surface 21*b* of the dielectric substrate 21, for example, using a pattern printing technology. In the embodiment, the former may be referred to as a right hand circular polarization antenna, and the latter may be referred to as a left hand circular polarization antenna.

In addition, the circular polarization antenna 20 includes a feed pin 25 having one end that is connected to a side end portion (a feed point) of the antenna element 23 on the spiral center side, and the other end that penetrates the dielectric substrate 21 in a thickness direction to pass through a hole 22*a* of the ground plate conductor 22 non-conductively and further penetrates the feed dielectric substrate 27 constituting the feed portion 26 to project from the surface thereof.

The feed portion 26 is not limited to the configuration of the microstrip line described above, and may be a configuration in which power is supplied from the other end side of the feed pin 25 by an unbalanced feed line, such as a coaxial cable, a coplanar line or microstrip line with the ground plate conductor 22 as a ground, or the like. The circular polarization antenna 20 having the configuration illustrated in FIG. 7A is fed with power from the feed pin 25 so that a radio wave of left hand circular polarization (LHCP) in which a rotation direction of a main polarized wave is left handed can be radiated from the antenna element 23. On the other hand, the circular polarization antenna 20 having the configuration illustrated in FIG. 7B is fed with power from the feed pin 25 so that a radio wave of right hand circular polarization (RHCP) in which a rotation direction of a main polarized wave is right handed can be radiated from the antenna element 23. It should be noted that in the drawings after FIG. 8, only a configuration in which the main polarization is LHCP is illustrated unless otherwise noted.

However, in the circular polarization antenna having only such a structure, surface waves along the surface of the dielectric substrate 21 are excited. Accordingly, desired characteristics of a circular polarization antenna cannot be obtained due to an influence of the surface waves.

Therefore, in the circular polarization antenna 20 of the embodiment, a cavity structure constituted by a plurality of metal posts 30 is adopted, as illustrated in FIGS. 9A and 10, in addition to the above-described structure as a structure for suppressing the excitation of the surface waves along the surface of the dielectric substrate 21.

Specifically, for example, one end side of each of the plurality of columnar metal posts 30 is connected to the ground plate conductor 22, each of the metal posts 30 penetrates the dielectric substrate 21 in a thickness direction thereof, and the other end side of each of the metal posts 30 extends to the opposite surface 21*b* of the dielectric substrate 21. The metal posts 30 are provided at predetermined intervals to surround the antenna element 23 and constitute the cavity.

Furthermore, the circular polarization antenna 20 of the embodiment includes a frame-shaped conductor 32 that is provided on the opposite surface 21*b* side of the dielectric substrate 21, sequentially short-circuits the other end sides of the plurality of metal posts 30 in an arrangement direction thereof, and extends a predetermined distance from the connection position with each metal post 30 to the antenna element 23, in addition to the cavity structure described above.

In the circular polarization antenna 20 of the embodiment, the surface waves can be suppressed by a synergetic effect of the cavity structure and the frame-shaped conductor 32. That is, the circular polarization antenna 20 according to the embodiment can greatly suppress leakage of radio waves from the antenna side surface by including the cavity structure and the frame-shaped conductor 32, as compared with than a general planar antenna of the related art.

As illustrated in FIG. 9B, the plurality of metal posts 30 can be realized as a plurality of hollow metal posts 30' by forming a plurality of holes 301 penetrating the dielectric substrate 21 and performing plating (through hole plating) on inner walls of the plurality of holes 301.

In this case, lower end portions of the plurality of hollow metal posts 30' formed by through-hole plating are connected to the ground plate conductor 22 via lands 302 formed on the one surface 21*a* of the dielectric substrate 21 by pattern printing technology.

The circular polarization antenna 20 configured as described above is configured such that the opposite surface 21*b* faces a radiation surface of the antenna 110 of the DUT 100 and one surface of the DUT 100 and is spatially coupled to the antenna 110.

Hereinafter, structural parameters of each portion, and simulation results of characteristics of the circular polarization antenna 20 obtained by changing the structural parameters will be described in order to describe the effect of surface wave suppression using the cavity structure and the frame-shaped conductor 32.

First, elements that can be structural parameters of each portion will be described.

A use frequency of the circular polarization antenna 20 is 18 to 40 GHz in K and Ka bands. A square spiral of the antenna element 23 has a basic length of a0. Lines having a length of a0 and a length of any multiple of a0 are disposed at angles of 90 degrees.

Figure 11A:
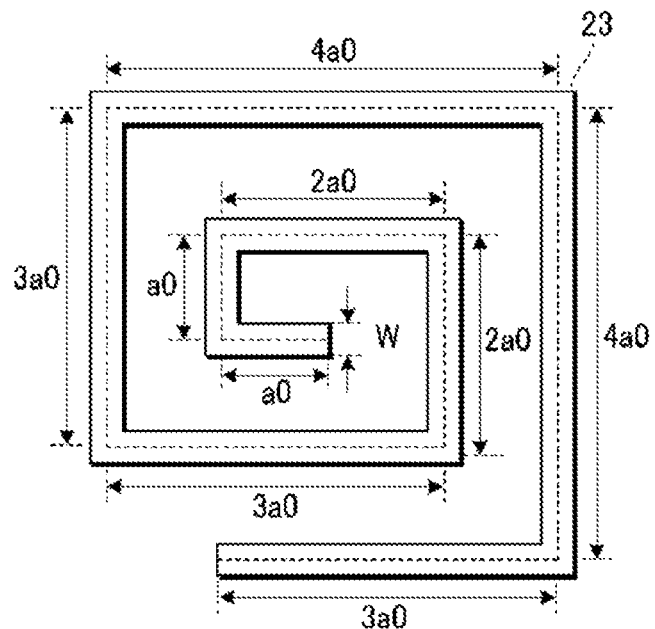
FIG. 11A is an enlarged cross-sectional view illustrating a configuration of main portions of the circular polarization antenna according to the embodiment of the present invention.

A typical example of such a square spiral is illustrated in FIG. 11A. That is, in this example, a nine-turn square spiral is formed as a whole, in which the element width W is 0.25 mm, the basic length a0 is 0.45 mm, the line lengths are 2a0, 2a0, 3a0, 3a0, 4a0, and 4a0 at angles of 90 degrees, and a final line length is about 3a0.

Figure 11B:
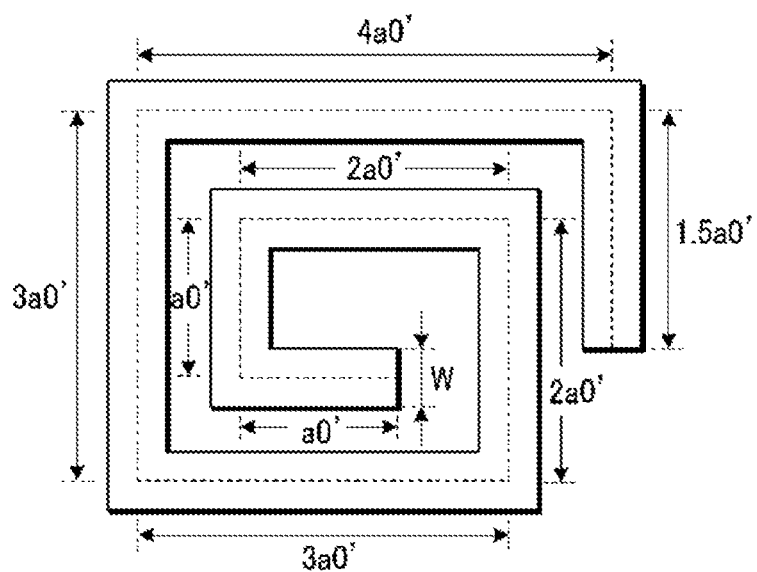
FIG. 11B is an enlarged cross-sectional view illustrating a configuration of a modification example of main portions of the circular polarization antenna according to the embodiment of the present invention.

Further, the square spiral illustrated in FIG. 11B has a basic length a0' that is longer than the basic length a0 in FIG. 11A, and the number of turns is reduced.

In this example, an eight-turn square spiral is formed as a whole, in which the element width W is 0.25 mm, the basic length a0' is 0.7 mm, the line lengths are 2a0', 2a0', 3a0', 3a0', and 4a0' at angles of 90 degrees, and a final line length is about 1.5a0'.

In this case, the final line length is selected as about 1.5a0' so that an axial ratio or reflection characteristics of the circular polarization is optimized.

In the following description and embodiments, an example of the square spiral is shown as the antenna element 23 to be adopted for the circular polarization antenna 20.

Figure 12:
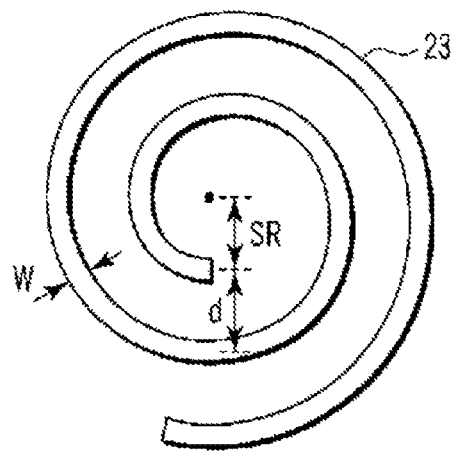
FIG. 12 is an enlarged cross-sectional view illustrating a configuration of another modification example of main portions of the circular polarization antenna according to the embodiment of the present invention.

However, as illustrated in FIG. 12, a circular spiral antenna element 23 can also be used, instead of the square spiral, as the antenna element 23 to be adopted for the circular polarization antenna 20.

The antenna element 23 of the circular spiral illustrated in FIG. 12 is, for example, an antenna element 23 with a circular spiral in which an initial radius value from a reference point SR=0.2 mm, an element width W=0.35 mm, a spiral distance d=0.2 mm, and the number of turns is 2.125. Even when this antenna element 23 with a circular spiral is used for the circular polarization antenna 20, substantially the same results as those in a case in which the antenna element 23 with the square spiral described above is used.

An outer shape of the dielectric substrate 21 is a square centered on a spiral center of the antenna element 23. As illustrated in FIGS. 7A and 7B, a length of one side the square is L (hereinafter referred to as an outer shape length), and an outer shape of the cavity is also a square that is concentric with the square of the dielectric substrate 21.

Further, the cavity has an inner dimension of Lw, as illustrated in FIGS. 9A and 9B. Further, a rim having a predetermined width (hereinafter referred to as a rim width) LR extending inward from an inner wall of the cavity is provided in the frame-shaped conductor 32.

Further, a diameter of each of the plurality of metal posts 30 forming the cavity is 0.3 mm, and a distance between the respective metal posts 30 is 0.9 mm.

Figure 13:
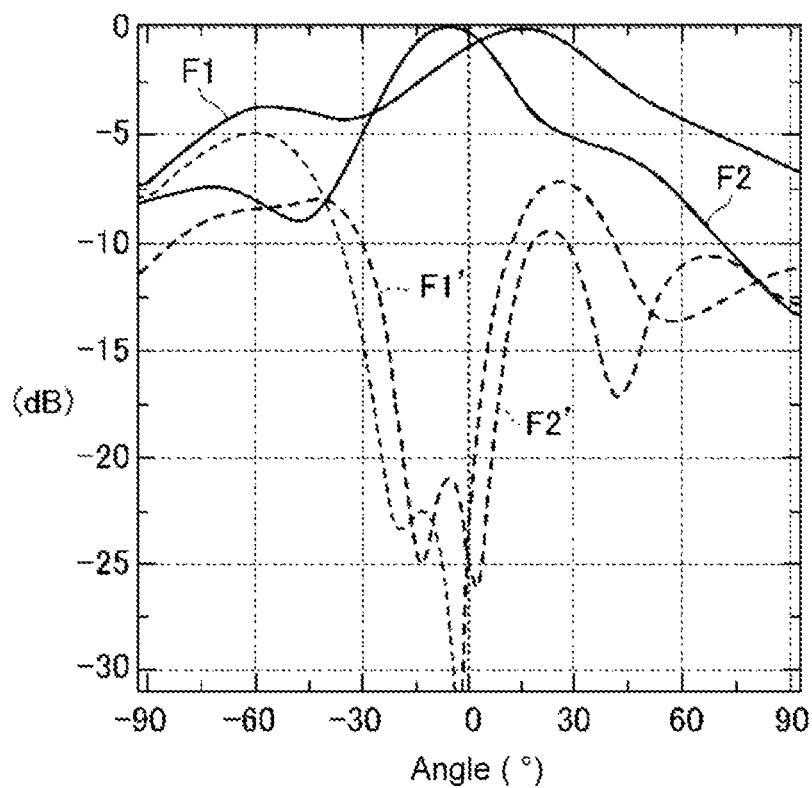
FIG. 13 is a characteristic diagram when the configuration of the main portions of the circular polarization antenna in the embodiment of the present invention is detached.

FIG. 13 illustrates a simulation result of radiation characteristics of a vertical surface (a yz surface in FIGS. 6 and 7) in a case in which the cavity and the frame-shaped conductor 32 are not provided by the plurality of metal posts 30.

In FIG. 13, F1 and F1' are characteristics of the main polarization (left hand circular polarization: LHCP) and cross polarization (right hand circular polarization: RHCP) when an outer shape length L=18 mm, and F2 and F2' are characteristics of the main polarization and the cross polarization when the outer shape length L=24 mm.

Here, the radiation characteristics required for a circular polarization antenna are broad single-peak characteristics symmetrical about a 0° direction with respect to the main polarization, and for the cross polarization (which is zero in the case of perfect circular polarization), radiation intensity needs to be sufficiently lower than for the main polarization in a broad angle range.

On the other hand, it can be seen that the characteristics F1 and F2 of the main polarization in FIG. 13 are both asymmetrical and include large rampage in a gain, and the cross polarization becomes at a radiation level that is the same as or close to the main polarization near −60° and −40°.

Disturbance of such radiation characteristics is generated due to an influence of the surface waves described above.

Figure 14:
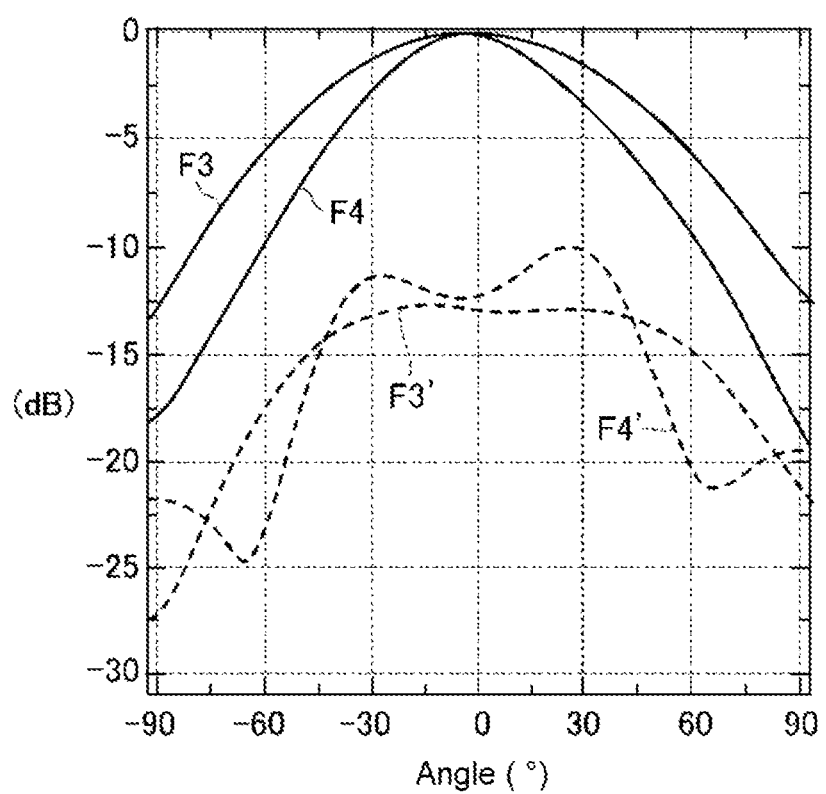
FIG. 14 is a characteristic diagram when the configuration of the main portions of the circular polarization antenna in the embodiment of the present invention is used.

FIG. 14 illustrates simulation results of characteristics F3 and F4 of the main polarization and characteristics F3' and F4' of the cross polarization in a case in which an outer shape length L=18 mm and L=24 mm when a cavity of an inner dimension Lw=9 mm is provided by the plurality of metal posts 30 and the frame-shaped conductor 32 having a rim width LR=1.2 mm is further provided.

As is apparent from FIG. 14, it can be seen that the characteristics F3 and F4 of the main polarization are broad single-peak characteristics symmetrical with a 0° direction, the characteristics F3' and F4' of the cross polarization also show a slow change at a radiation intensity sufficiently lower than that of the main polarizations F3 and F4 in a broad angular range, and desired characteristics required as the circular polarization antenna are obtained.

In addition, a result of simulation for various radiation characteristics that are the same as the above, which is performed by changing the structural parameters of each portion, reveals that the radiation characteristics in a case in which there is no frame-shaped conductor 32 shows dependence on the outer shape length L of the dielectric substrate 21 and an in-cavity dimension Lw and, when the outer shape length L is large (L=24, 18 mm), main polarization characteristics approach a single-peak shape from a three-peak shape as the in-cavity dimension Lw increases from 3 to 10 mm, as a rough tendency.

Further, it is revealed that, when the outer shape length L of the dielectric substrate 21 is relatively small (L=12 mm), the main polarization characteristics approaches a single peak shape from a double peak shape as the in-cavity dimension Lw increases from 3 to 10 mm.

However, it is revealed in any case that rampage of the cross polarization is large, a difference between a cross polarization component and a main polarization component is small in a used angle range, polarization selectivity is low, and desired characteristics as illustrated in FIG. 14 are not reached.

The rim width LR of 1.2 mm corresponds to approximately ¼ of a wavelength of the surface waves propagating along the surface of the dielectric substrate 21. That is, a portion of the rim width LR=1.2 mm forms a transmission path having a length of $\lambda g/4$ ($\lambda g$ is a wavelength in a tube), of which the impedance becomes infinite with respect to the surface waves, when a post wall side is viewed from a tip side thereof.

Therefore, a current does not flow along the surface of the dielectric substrate 21, and this current blocking operation suppresses the excitation of the surface waves, thereby preventing rampage of the radiation characteristics.

Therefore, when the circular polarization antenna 20 is applied to other frequency bands other than that described above, the rim width LR may be changed and set according to frequencies in the frequency bands.

Incidentally, in the circular polarization antenna 20 of the embodiment, it can be considered that the resonator is constituted by providing the cavity and the frame-shaped conductor 32 using the plurality of metal posts 30 on the dielectric substrate 21, and this resonator is excited by the antenna element 23.

Since the circular polarization antenna 20 of the embodiment constitutes a resonator, there is a resonance frequency, and input impedance of the circular polarization antenna 20 becomes very great and radiation is not performed at the resonance frequency.

In this case, the resonance frequency of the resonator is determined by the structural parameters of the resonator and the antenna element 23 of circular polarization.

The structural parameters include the number of turns of the antenna element 23, the basic length a0 of the antenna element 23, the element width W of the antenna element 23, and the like, in addition to the inner dimension Lw of the cavity and the rim width LR, as described above.

Therefore, in frequency characteristics of an antenna gain, a sharply deep notch is generated near the resonance frequency. This resonance frequency can be set to a desired value by adjusting the structural parameters described above.

Next, a configuration of the coupling antenna holding module 70 using the circular polarization antenna 20 described above as the coupling antenna 80 will be described with reference to FIGS. 15 to 24.

Figure 16:
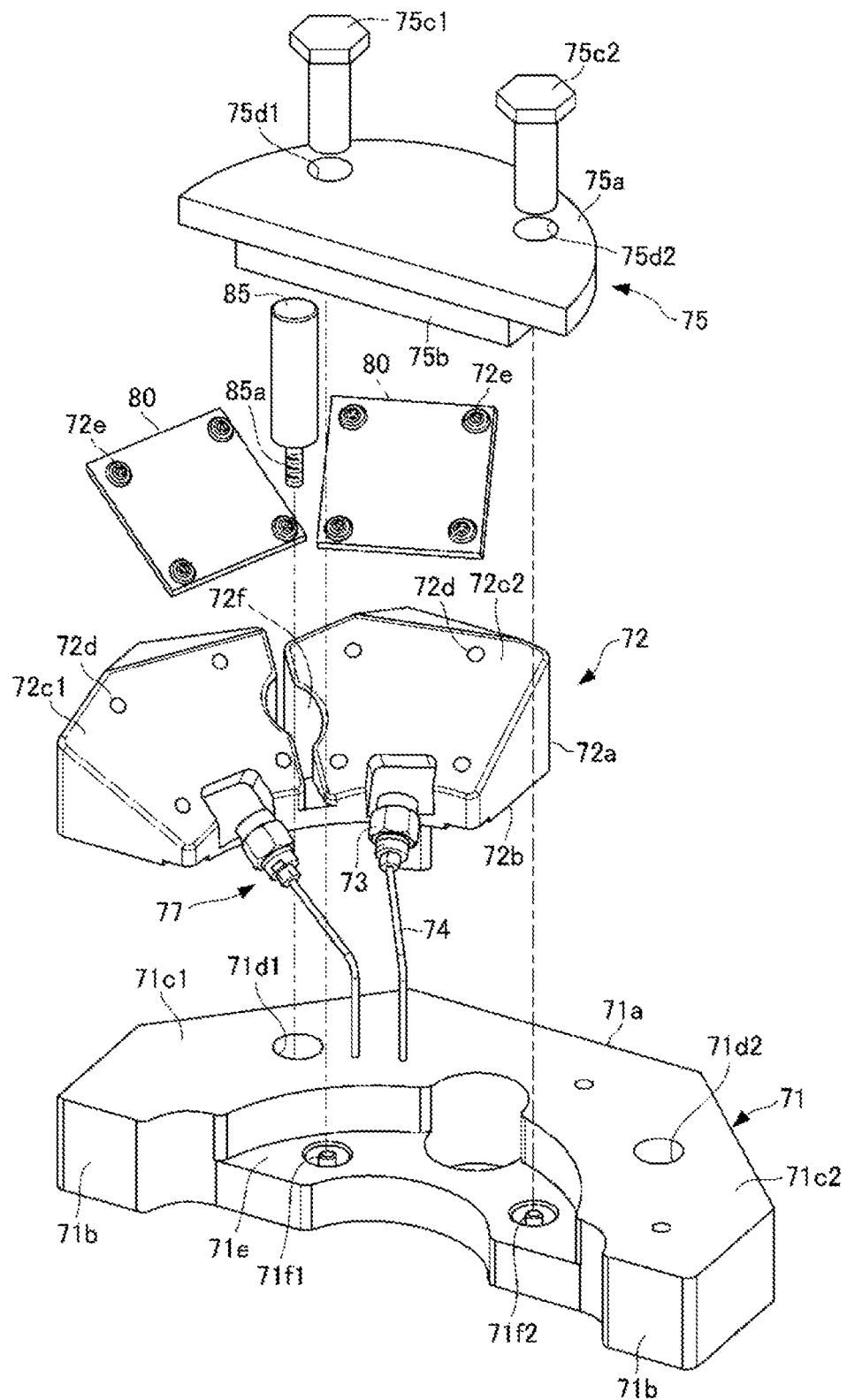
FIG. 16 is an exploded perspective view illustrating a structure of a coupling antenna holding module according to the embodiment of the present invention.

The coupling antenna holding module 70 illustrated in FIG. 15 is constituted by an assembly (a module) of a pedestal portion 71, an antenna attachment stand 72, and a connection portion cover 75 that can be disassembled in an aspect illustrated in FIG. 16. The pedestal portion 71, the antenna attachment stand 72, and the connection portion cover 75 are made of resin, for example.

As illustrated in FIGS. 15 and 16, the pedestal portion 71 is configured as, for example, the pedestal portion body 71*a* including a plate-shaped member having a planar shape that is divided into two in a bilateral symmetric manner by a straight line connecting respective middle points of one side of the regular octagon and a facing side that faces the one side. In the coupling antenna holding module 70, the pedestal portion 71 is not limited to the planar shape obtained by dividing the regular octagon into two, and may be configured as block members obtained by dividing a regular n-gon plate-shaped member having n or more sides into two in a bilateral symmetric manner using a straight line connecting respective middle points of one of the n-gon shape and the facing side that faces the one side.

The pedestal portion body 71*a* has a side surface 71*b* along the straight line that divides the regular octagon into two. By causing the two shapes to face each other so that the side surface 71*b* abuts on each other, one planar shape of one regular octagon is obtained. The pedestal portion body 71*a* is formed so that the stand attachment surfaces 71*c*1 and 71*c*2 are adjacent to an upper surface configured as a flat surface. Mount insertion holes 71*d*1 and 71*d*2 penetrating the pedestal portion body 71*a* in the thickness direction are formed in the stand attachment surfaces 71*c*1 and 71*c*2, respectively. The mount insertion holes 71*d*1 and 71*d*2 are provided at an interval corresponding to the installation interval of the mount members 60, and configured so that the mount member 60 can be detachably inserted into mount insertion holes 71*d*1 and 71*d*2. The mount insertion holes 71*d*1 and 71*d*2 constitute insertion holes in the present invention. Although the example in which the stand attachment surfaces 71*c*1 and 71*c*2 are at the same height and on a common surface has been described herein, the stand attachment surfaces 71*c*1 and 71*c*2 may be on surfaces having different heights.

In the pedestal portion body 71*a*, a step surface 71*e* having a small thickness on the outer side is formed in a region on the inner side of the stand attachment surfaces 71*c*1 and 71*c*2. Cover mounting holes 71*f*1 and 71*f*2 are provided in respective regions corresponding to the stand attachment surfaces 71*c*1 and 71*c*2 in the step surface 71*e*.

In the antenna attachment stand 72, a bottom surface portion 72*b* of an attachment stand body portion 72*a* is formed flat, a bottom surface portion 72*b* has an area corresponding to one stand attachment surface 71*c*1 (71*c*2) of the pedestal portion body 71*a*. Further, in the antenna attachment stand 72, antenna attachment surfaces 72*c*1 and 72*c*2 formed on an upper surface opposite to the bottom surface portion 72*b*. The antenna attachment surfaces 72*c*1 and 72*c*2 are formed by planes that are inclined downward from the outer peripheral side to the inner side. Further, screw holes 72*d* are formed at four corners of the antenna attachment surfaces 72*c*1 and 72*c*2.

The screw hole 72*d* is configured to be capable of screwing an attachment screw 72*e* for attaching the coupling antenna 80 on the antenna attachment surfaces 72*c*1 and 72*c*2.

In the antenna attachment stand 72, a screw insertion hole 72*f* penetrating in a thickness direction is formed at a position interposed between the antenna attachment surfaces 72*c*1 and 72*c*2 of the attachment stand body portion 72*a*. The screw insertion hole 72*f* has a diameter such that the thumb screw 85 can be is detached in a vertical direction in FIG. 16 via the mount insertion holes 71*d*1 and 71*d*2.

The attachment stand body portion 72*a* is disposed at a position on the inward side of the antenna attachment surfaces 72*c*1 and 72*c*2 in a state in which the connector 73 connected to the feed line 74 faces the antenna attachment surfaces 72*c*1 and 72*c*2. The feed line 74 is electrically connected to the wireless terminal measurement device 1. On the other hand, the connector 73 has a structure that is fitted to a fitting connector connected to the feed portion (see FIGS. 9A and 9B) of the circular polarization antenna 20, which is used as the coupling antenna 80. Accordingly, in the coupling antenna holding module 70, it is possible to supply power to the coupling antenna 80 through the feed line 74 from the wireless terminal measurement device 1 by fitting the fitting connector to the connector 73.

The connection portion cover 75 covers the connection portion 77 that electrically connects the coupling antenna 80 to the feed line 74 via the metal connector 73, from the upper side below the coupling antenna 80. The connection portion cover 75 includes a cover body 75*a*, a back lid portion 75*b*, and attachment screws 75*c*1 and 75*c*2. The cover body 75*a* is configured as a semicircular plate member having a larger area than the step surface 71*e* of the pedestal portion 71, and the back lid portion 75*b* is configured as a semicircular plate member having a smaller area than the step surface 71*e*. The connection portion cover 75 has a laminated structure in which the back lid portion 75*b* is pasted to a back surface of the cover body 75*a*, and attachment holes 75*d*1 and 75*d*2 pass through the cover body 75*a* and the back lid portion 75*b* in a thickness direction are provided.

As illustrated in FIG. 16, the coupling antenna holding module 70 is constituted by an assembly of the antenna attachment stand 72 having the two antenna attachment surfaces 72*c*1 and 72*c*2 and the pedestal portion 71 having two stand attachment surfaces 71*c*1 and 71*c*2. In the antenna attachment stand 72, the coupling antenna 80 can be attached to at least one of the antenna attachment surfaces 72*c*1 and 72*c*2, and the antenna attachment stand 72 after the coupling antenna is attached to at least one of the stand attachment surfaces 71*c*1 and 71*c*2 can be attached to the pedestal portion 71.

Figure 17:
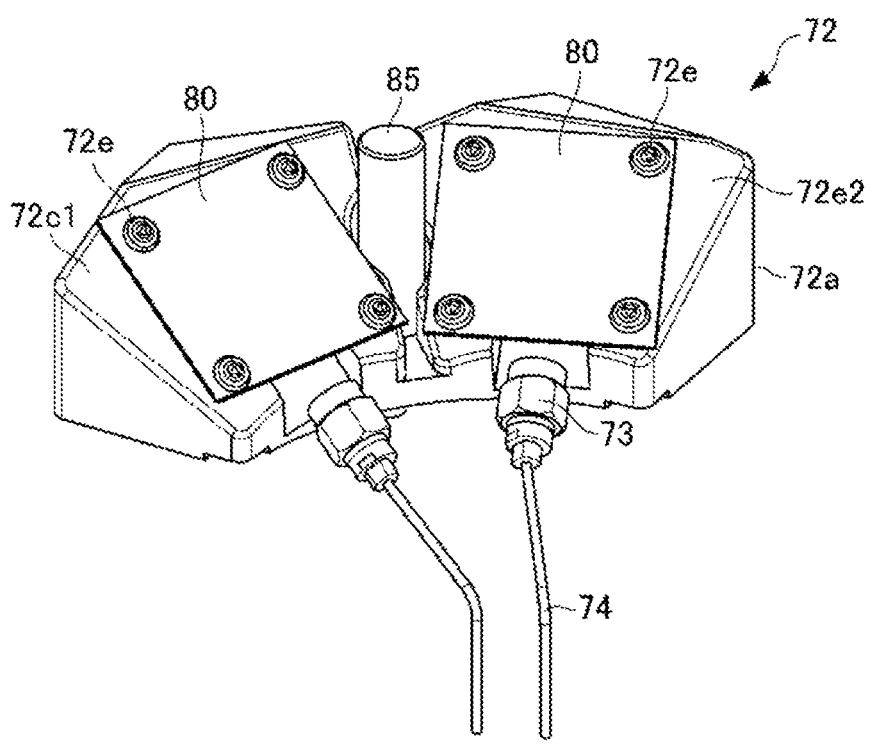
FIG. 17 is a perspective view illustrating a structure of an antenna attachment portion of the coupling antenna holding module according to the embodiment of the present invention.

In the configuration illustrated in FIG. 16, the pair of coupling antennas 80 can be attached to the antenna attachment stand 72 by causing the pair of coupling antennas to be adjacent to the respective antenna attachment surfaces 72*c*1 and 72*c*2, and in this state, manipulating the attachment screws 72*e* passing through the screw holes provided at the four corners of each coupling antenna 80 so that the attachment screws 72*e* is screwed into the screw hole 72*d*. The configuration of the antenna attachment stand 72 to which the pair of coupling antennas 80 have been attached is illustrated in FIG. 17. As the coupling antenna 80 attached to the antenna attachment stand 72, for example, it is desirable to attach a right hand circular polarization antenna and a left hand circular polarization antenna as a set of two circular polarization antennas to each antenna attachment stand 72. Further, a set of right hand circular polarization antennas and left hand circular polarization antennas radiate, for example, signals having different properties (right handed circular polarized waves and left handed circular polarized waves) in a predetermined band in a 28G band. In the embodiment, a configuration in which it is possible to radiate signals having different properties in each of four different frequency bands in the 28G band by using four sets of right hand circular polarization antennas and left hand circular polarization antennas can be adopted.

Figure 18:
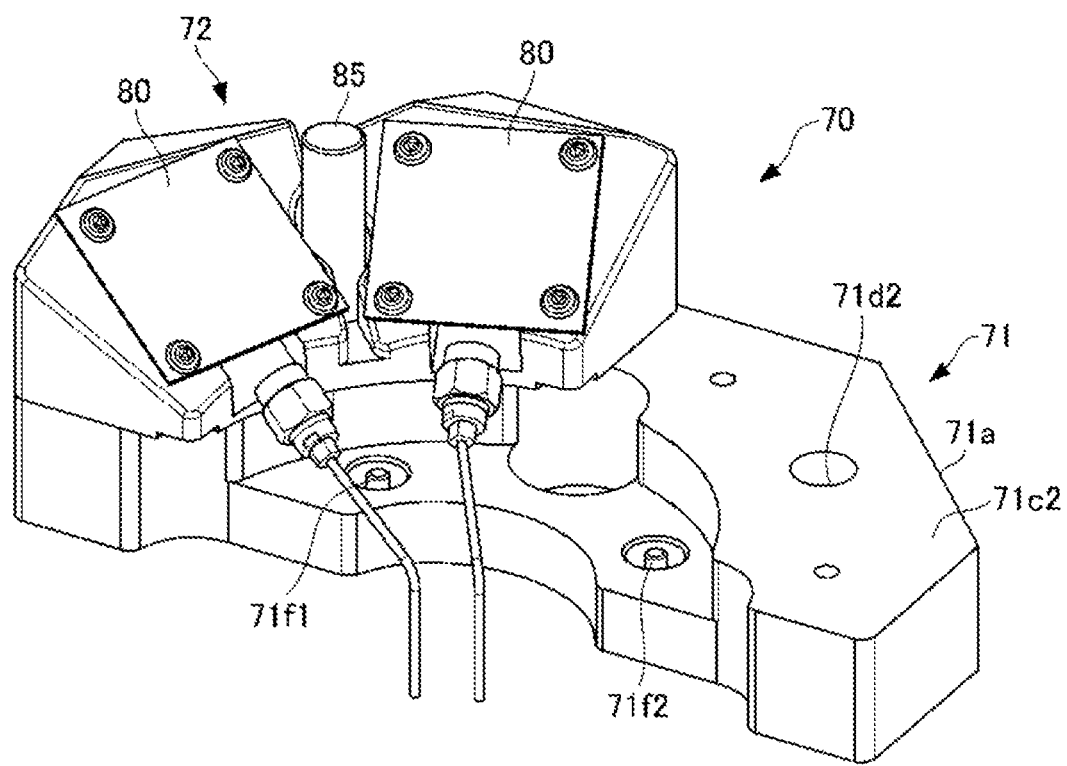
FIG. 18 is a perspective view illustrating an example of an attachment aspect of the antenna attachment portion with respect to a pedestal portion in the coupling antenna holding module according to the embodiment of the present invention.

The antenna attachment stand 72 to which the pair of coupling antennas 80 is attached can be disposed on the stand attachment surface 71c1 adjacent to, for example, the stand attachment surface 71c2 of the pedestal portion 71 in an aspect illustrated in FIG. 18 using a thumb screw 85. Further, the antenna attachment stands 72 to which the pair of coupling antennas 80 is attached can be disposed adjacent to the stand attachment surfaces 71c1 and 71c2 of the pedestal portion 71, as a set of two antenna attachment stands as illustrated in FIG. 19, according to the same procedure at the time of attachment in the aspect illustrated in FIG. 18.

Figure 19:
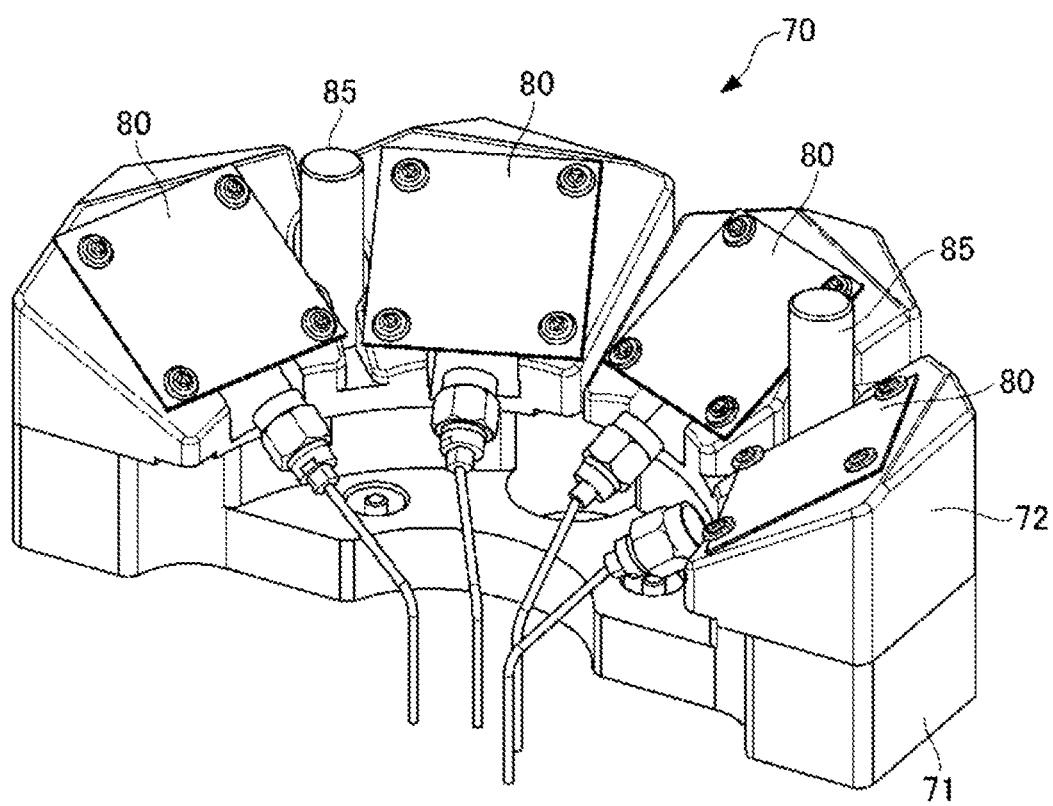
FIG. 19 is a perspective view illustrating another example of the attachment aspect of the antenna attachment portion with respect to the pedestal portion in the coupling antenna holding module according to the embodiment of the present invention.
Figure 20:
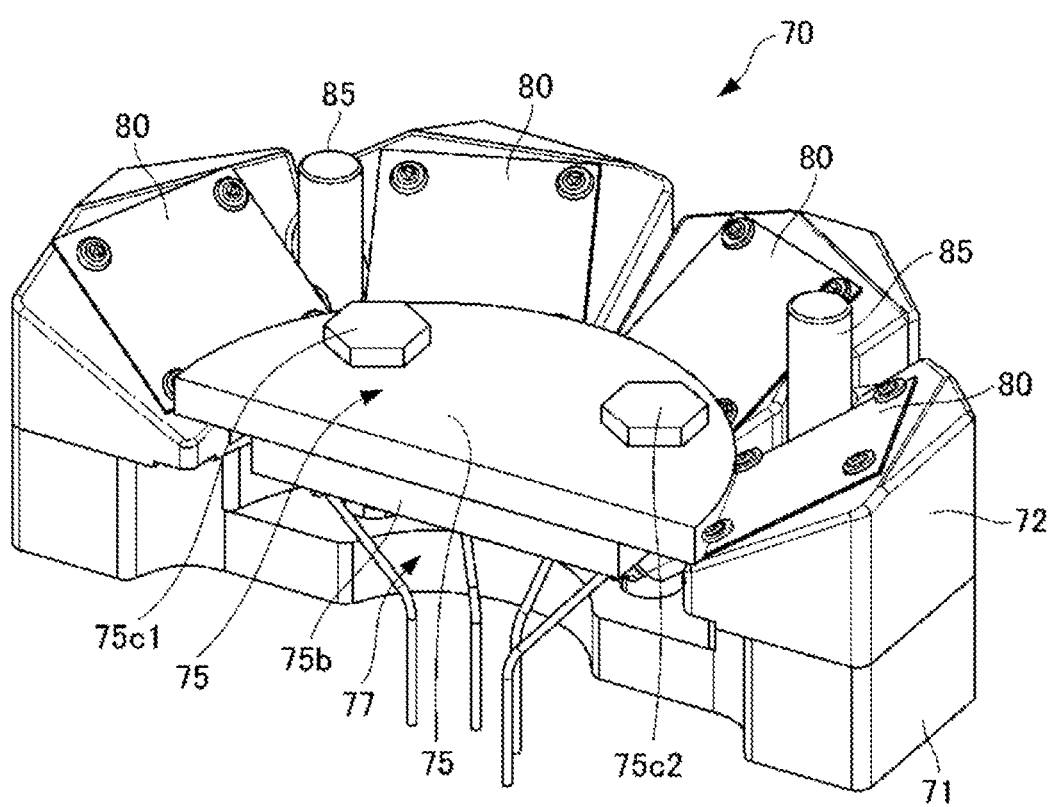
FIG. 20 is a perspective view illustrating an attachment aspect of a connection portion cover in the coupling antenna holding module of FIG. 19.

Further, in the coupling antenna holding module 70, the connection portion cover 75 can be attached to the pedestal portion 71 in an aspect as illustrated in FIG. 20 in a state in which the four coupling antennas 80 are attached in an aspect as illustrated in FIG. 19. The connection portion cover 75 can be attached even in a state in which two coupling antennas 80 are attached in an aspect illustrated in FIG. 18. When the connection portion cover 75 is attached, the mounting holes 75d1 and 75d2 and the cover attachment holes 71f1 and 71f2 of the pedestal portion 71 may be positioned, and then, the attachment screws 75c1 and 75c2 may be passed through the mounting holes 75d1 and 75d2 and screwed into the cover attachment holes 71f1 and 71f2 of the pedestal portion 71.

Here, an arrangement procedure of the pedestal portions on the bottom surface 51a of the electromagnetic wave shield box 50 will be described. The pedestal portion 71 illustrated in FIG. 16 can be disposed on the bottom surface 51a of the electromagnetic wave shield box 50 illustrated in FIG. 4 using the mount member 60 and the thumb screw 85 provided on the bottom surface 51a. In this case, in order to dispose the pedestal portion 71 at a desired position, the pedestal portion 71 is brought to a desired disposition position, and the two mount members 60 having the same spacing distance as that between the mount insertion holes 71d1 and 71d2 are inserted into the mount insertion holes 71d1 and 71d2. Further, the pedestal portion 71 may be engaged with the annular end surface 60c formed on the mount member 60 and lowered until a downward movement is stopped.

Figure 21A:
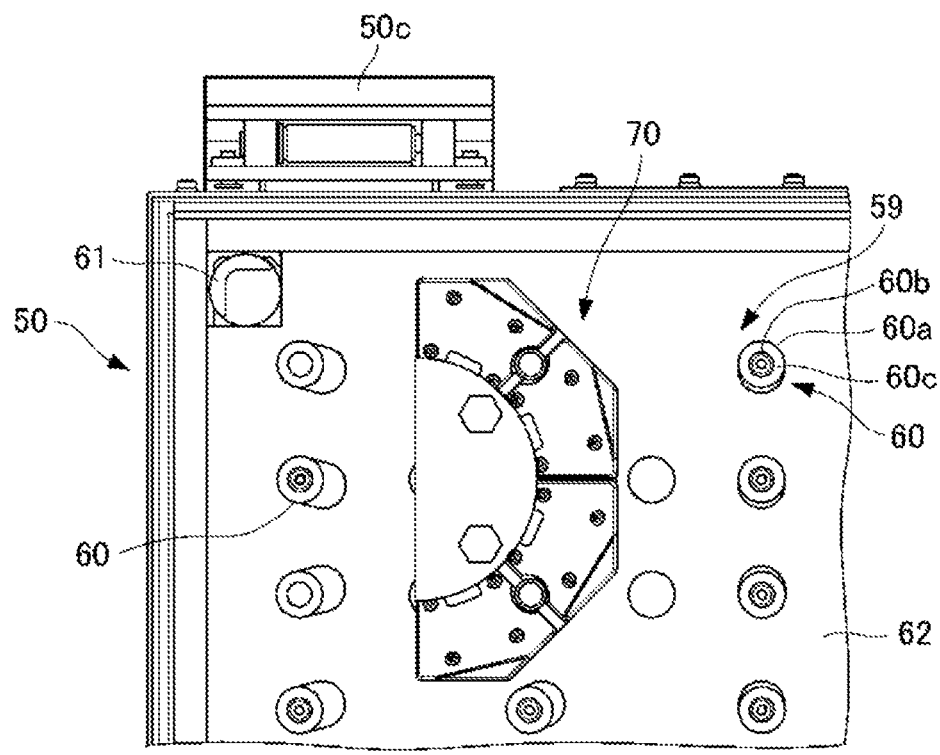
FIGS. 21A and 21B are diagrams illustrating a division disposition aspect of a coupling antenna holding module in the electromagnetic wave shield box according to the embodiment of the present invention.
Figure 21B:
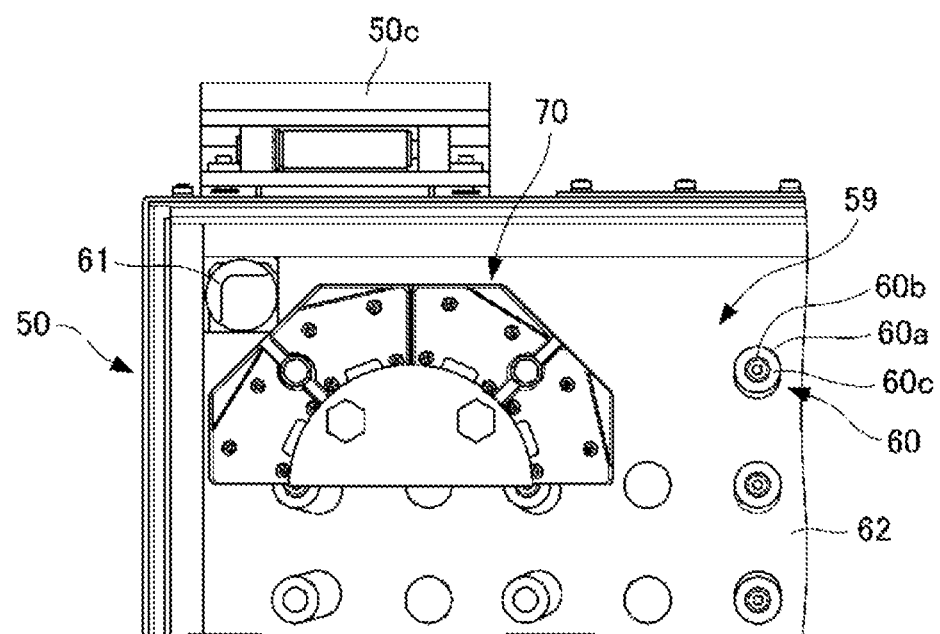

A division disposition aspect of the coupling antenna holding module 70 in the electromagnetic wave shield box 50 is will be described with reference to FIGS. 21A and 21B. FIG. 21A illustrates an example of a vertical arrangement of the pedestal portion 71 and the antenna attachment stand 72, and FIG. 21B illustrates an example of a horizontal arrangement of the pedestal portion 71 and the antenna attachment stand 72. Thus, one pedestal portion 71 can be disposed in desired vertical and horizontal directions at a position defined by the two mount members 60 by the mount insertion holes 71d1 and 71d2 being inserted into the alternate mount members 60.

Next, a procedure for attaching the antenna attachment stand 72 to which the coupling antennas 80 have been attached, to the pedestal portion 71 arranged in the division disposition aspect illustrated in FIGS. 21A and 21B will be described with reference to FIG. 16. In this case, first, the antenna attachment stand 72 is brought to an upper position of the pedestal portion 71, and is positioned with respect to the pedestal portion 71 such that the screw insertion hole 72f matches the mount insertion hole such as 71d1 of the pedestal portion 71 on the lower side. Then, the bottom surface of the pedestal portion 71 is engaged with the annular end surface 60c formed in the mount member 60, and the pedestal portion 71 is lowered until a downward movement is stopped. Then, the thumb screw 85 is inserted into the screw insertion hole 72f and the mount insertion hole 71d1. In this state, a rotation manipulation is performed such that a screw formed at a distal end portion of the thumb screw 85 is screwed into a tap hole of each mount member 60 inserted into the mount insertion holes 71d1 and 71d2 of the pedestal portion 71. The thumb screw 85 tightens the pedestal portion and the antenna attachment stand 72 in a stacking direction in a state in which the thumb screw 85 is rotated until it becomes difficult for the thumb screw 85 to rotate, such that the antenna attachment stand 72 can be attached to the pedestal portion 71.

In the coupling antenna holding module 70 according to the embodiment, the pedestal portions 71 can be not only disposed at different positions one by one (see FIGS. 21A and 21B), but also can be disposed so that the two pedestal portions 71 face each other and form in a regular octagonal planar shape (see FIGS. 4 and 15). Accordingly, in the embodiment, in a test of the DUT 100 using the electromagnetic wave shield box 50, for example, any one of the disposition aspects of the coupling antenna holding module 70 illustrated in FIGS. 26A and 26B can be selected.

Figure 22A:
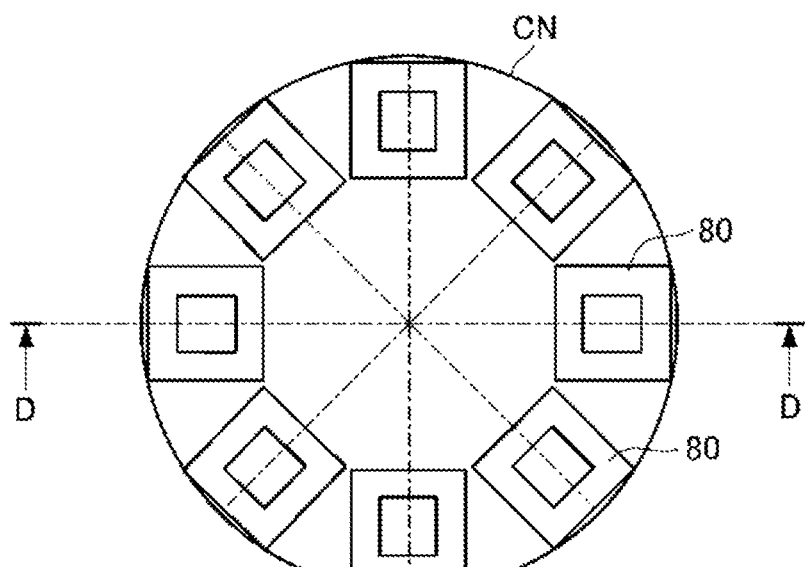
FIGS. 22A and 22B are schematic diagrams illustrating a disposition aspect of coupling antenna holding module in the electromagnetic wave shield box according to the embodiment of the present invention.
Figure 22B:
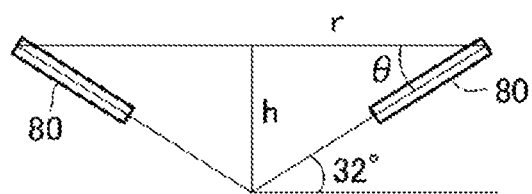

Next, a disposition aspect of the coupling antennas 80 with respect to the coupling antenna holding module 70 in the electromagnetic wave shield box 50 according to the embodiment will be described with reference to FIGS. 22A and 22B. FIG. 22A illustrates a disposition aspect when the coupling antenna holding module 70 is viewed from above, and FIG. 22B illustrates a disposition aspect when the coupling antenna holding module 70 is viewed from a cross-sectional side surface taken along a line D-D of FIG. 22A. In FIGS. 22A and 22B, in order to make it easy to understand the disposition aspect of the coupling antennas 80, a cone CN having a predetermined radius r and depth h and recessed at a downward slope θ is defined. In the coupling antenna holding module 70 according to the embodiment, a maximum of eight the coupling antennas 80 that can be mounted using two pedestal portions 71 are disposed at angles of 45 degrees obtained by dividing a circle in eight, in a circumferential direction of the circle that defines a top surface of the cone CN. The respective coupling antennas 80 are annularly disposed such that one of four sides of a rectangular antenna surface is inscribed in the circle. Further, in each coupling antenna 80, the flat antenna surface is attached to the inner side of the cone CN with the same downward slope as the downward slope θ of the cone CN.

FIGS. 22A and 22B particularly illustrate an attachment aspect of the coupling antennas 80 in a case in which eight coupling antennas 80 are arranged in an annular shape, but in this case, a positional relationship between the adjacent coupling antennas 80 and a downward slope θ are maintained even in a case in which the coupling antennas 80 are attached as a pair of two coupling antennas to the antenna attachment stand 72.

Figure 23:
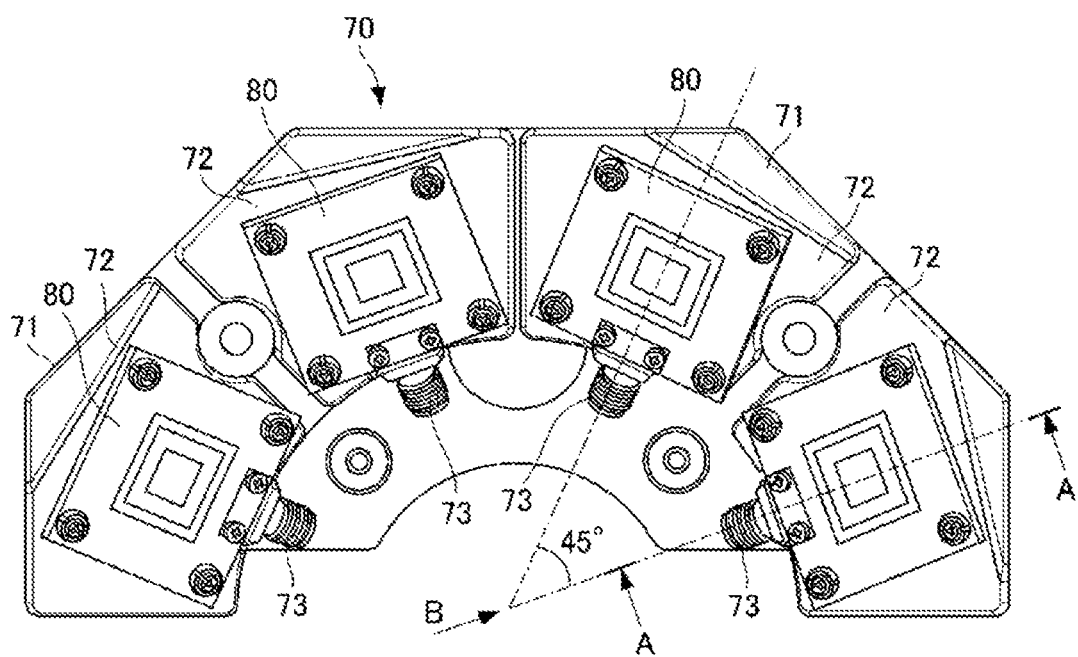
FIG. 23 is a top view of the coupling antenna holding module illustrating an annular disposition aspect of coupling antennas in the electromagnetic wave shield box according to the embodiment of the present invention.

A specific aspect of attachment of the coupling antennas 80 to the antenna attachment stand 72 will be described in greater detail with reference to FIGS. 23 and 24. FIG. 23 illustrates a structure viewed from the top when two antenna attachment stands 72 are placed on one pedestal portion 71 and assembled as the coupling antenna holding module 70, and then, a pair of coupling antennas 80 are attached to each antenna attachment stand 72, and as a result, a total of four coupling antennas 80 are attached. As illustrated in FIG. 23, the four coupling antennas 80 are annularly arranged at positions 45 degrees apart from each other on a horizontal surface. That is, the two antenna attachment stands 72 can be attached at an angle of 90 degrees to the pedestal portion 71 with respect to the two stand attachment surfaces 71c1 and 71c2.

Figure 24A:
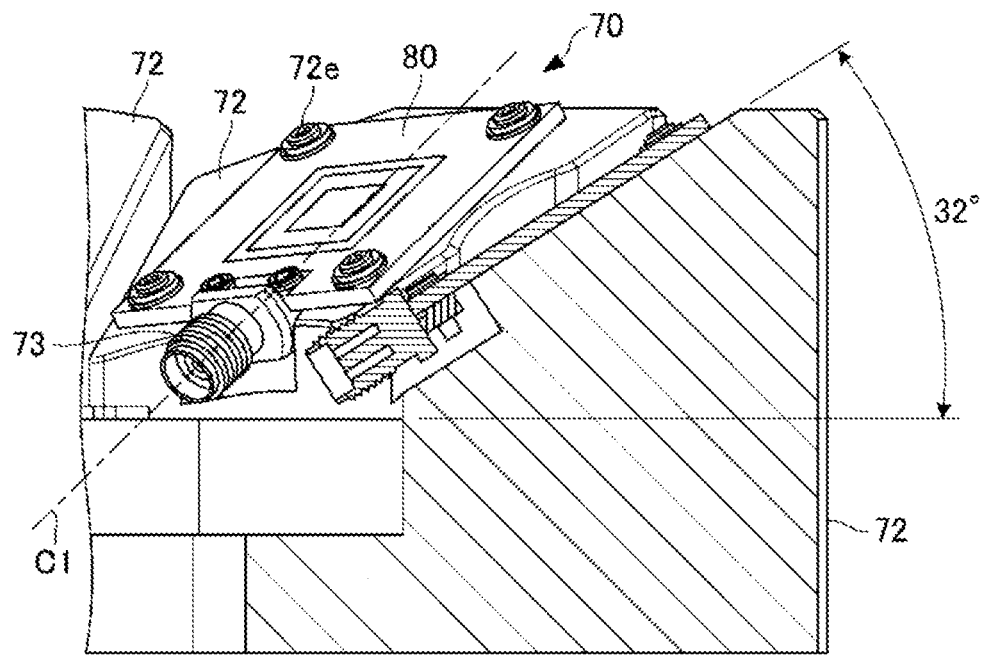
FIG. 24A is an enlarged cross-sectional view of the coupling antenna holding module taken along line A-A in FIG. 23.
Figure 24B:
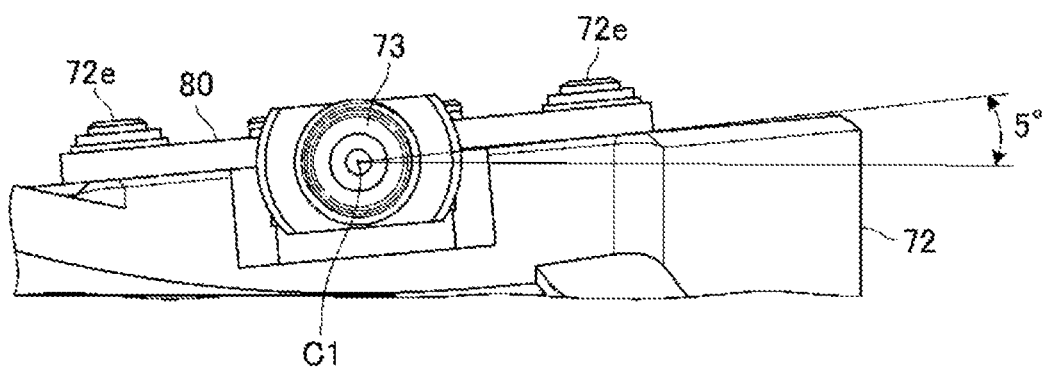
FIG. 24B is a side view of main portions viewed in a direction indicated by an arrow B in FIG. 23.

FIG. 24A is an enlarged cross-sectional view taken along a line A-A of the coupling antenna holding module 70 in FIG. 23, and FIG. 24B is a side view of main portions of the coupling antenna holding module 70 viewed in a direction indicated by an arrow B in FIG. 23. As illustrated in FIG. 24A, the respective coupling antennas 80 annularly disposed in the coupling antenna holding module 70 are inclined at the same angle with respect to a horizontal surface so that the coupling antennas 80 can radiate radio waves toward the same radiation point at respective upper positions. In the example of FIG. 24A, the coupling antennas 80 are inclined at an angle of 32 degrees (a first angle) (the emission point indicates an apex of an isosceles triangle, which has an apex angle that is an angle twice the first angle and a bottom side that is a diameter of a ring). Further, in the coupling antenna holding module 70, each of the coupling antennas 80 is held in a posture in which the coupling antenna 80 is rotated by a predetermined angle (a second angle) around a center axis C1 of the antenna in a direction orthogonal to a circumferential direction of a ring realizing an annular disposition (that is, a bottom angle of the isosceles triangle of a cross section is 32 degrees, which is the first angle, and the coupling antennas 80 is rotated by 5 degrees that is the second angle with a straight line connecting the apex of the cone extending to a horizontal surface with the ring formed due to the disposition of the respective coupled antennas set as a bottom surface, to the center of the antenna, as the center axis C1. A direction orthogonal to a circumferential direction of the ring realizing the annular disposition is parallel to a direction connecting the apex of the cone and the center of the antenna surface. The center of the antenna surface is defined as a phase center of the antenna. In this example, since the outer shape of each coupled antenna is a square and an antenna pattern is provided at a center of the outer shape of the antenna, the center of the antenna surface, the phase center of the antenna, the center of the antenna pattern, and the center of the outer shape of the antenna match). In the example of FIG. 24A, the coupling antenna 80 is maintained in a posture rotated by 5 degrees around the center axis C1. The disposition aspect in which the slope with respect to the horizontal surface is 32 degrees and an angle of the rotation around a center line is 5 degrees is the same as in the other coupling antennas 80 in FIG. 23. Further, an attachment aspect of each coupling antenna 80 when eight coupling antennas 80 are annularly attached using the two coupling antenna holding modules 70 and four antenna attachment stands (see FIGS. 4 and 15) is also the same as the case illustrated in FIGS. 23 and 24.

Next, an example of a process of the wireless terminal measurement method using the wireless terminal measurement device 1 according to the embodiment will be described with reference to a flowchart of FIG. 25. In a measurement process illustrated in FIG. 25, first, the coupling antenna holding module 70 in the electromagnetic wave shield box 50 and the DUT 100 that is a target under test are set in the electromagnetic wave shield box 50 (step S1).

As a procedure in this case, first, a desired system configuration is determined, and a necessary number of pedestal portions 71, antenna attachment stands 72, and coupling antennas 80 are prepared. Then, the pedestal portion is attached to a desired position of the bottom surface 51a of the casing body portion 50a using the mount member 60, and the antenna attachment stands 72 are attached thereon. Subsequently, the coupling antennas 80 are attached to the antenna attachment stands 72. The antenna attachment stands may be attached to the pedestal portion 71 after the coupling antennas 80 are attached. Further, the coupling antennas 80 attached to the antenna attachment stands 72 are connected to the feed line 74 by the connector 73. The feed line 74 is connected to the switching unit 45 of the wireless terminal measurement device 1 through a wiring through hole 50e (see FIG. 2A) provided on one side surface of the casing body portion 50a.

After the connection of the coupling antenna 80 to the feed line 74 is completed, the connection portion cover 75 is attached to the pedestal portion 71. Then, the DUT holding portion 63 is attached to the DUT holding portion installation member 61, and the DUT 100 is place on an upper surface of the DUT holding portion 63 so that the antenna formation surface faces the attached coupling antenna 80 side. In the DUT holding portion 63, it is possible to adjust a position in a horizontal direction of the DUT 100 by appropriately changing an attachment position of the regulation member 63a. Accordingly, the user adjusts the position of the DUT 100 so that the radiation point of each coupling antenna 80 held by the coupling antenna holding module 70 is determined in the region of the antenna formation surface.

Furthermore, the DUT 100 is USB-connected to a USB cable extending from the USB box 65, and then, the lid portion 50b is closed with respect to the casing body portion 50a, and the lid portion 50b is stopped by the fastener 50d. Accordingly, in the electromagnetic wave shield box 50, the DUT 100 and the plurality of coupling antennas 80 held by the coupling antenna holding module 70 can be sealed so that penetration of electromagnetic waves from the outside into an internal space of the casing body portion 50a can be shielded, and the DUT 100 is ready for a test.

After test preparation is completed, the signal transmission unit 42 of the measurement unit 41 outputs a test signal to the DUT 100 via the coupling antenna 80 (the circular polarization antenna 20) and the antenna 110 of the DUT 100 according to a predetermined test start manipulation by the user (signal transmission step S2).

Then, the signal reception unit 43 of the measurement unit 41 receives a signal under measurement output from the DUT 100 to which the test signal has been input, via the antenna 110 and the coupling antenna 80 of the DUT 100 (signal reception step S3).

Then, the analysis processing unit 44 of the measurement unit 41 performs an analysis process compatible with a communication standard of the DUT 100 on the signal under measurement received in the signal reception step S3 (analysis processing step S4).

Figure 25:
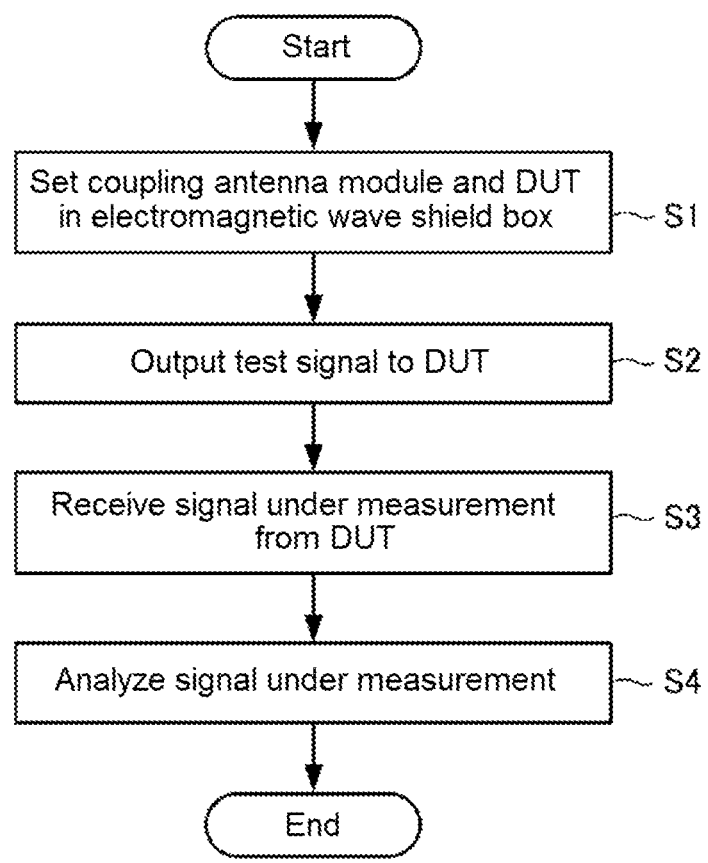
FIG. 25 is a flowchart illustrating a process of a wireless terminal measurement method using a wireless terminal measurement device using the electromagnetic wave shield box 50 according to the embodiment of the present invention.
Figure 26A:
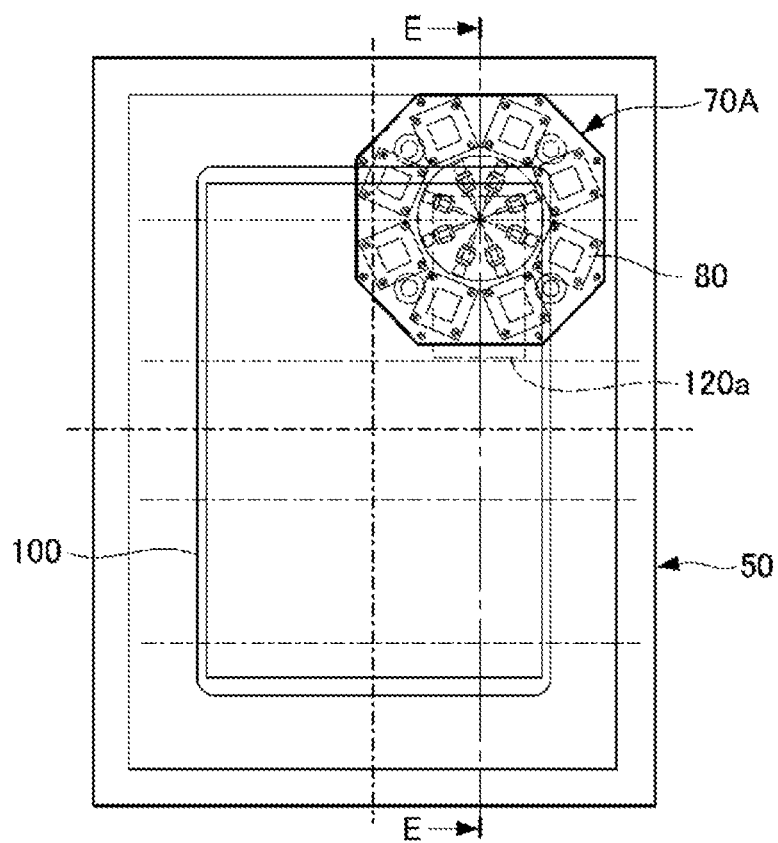
FIGS. 26A and 26B are diagrams illustrating a disposition aspect of a coupling antenna holding module of the electromagnetic wave shield box according to the embodiment of the present invention.
Figure 26B:
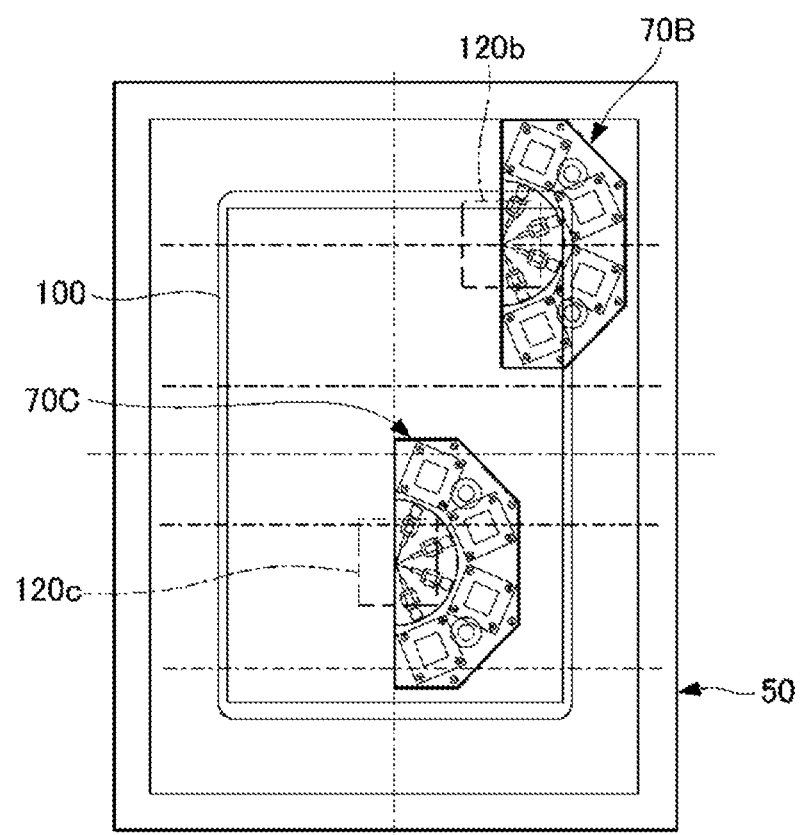

During the series of processes illustrated in FIG. 25, in step S1, the disposition aspect illustrated in FIG. 26A or FIG. 26B, for example, can be selected as a disposition aspect of the coupling antenna holding modules 70 according to, for example, a position of the antenna formation surface on which the antenna 110 of the DUT 100 is formed. FIG. 26A illustrates an example in which two pedestal portions 71 each having a planar shape obtained by dividing a regular octagon in two are combined with the regular octagon and displaced at one place, and FIG. 27B illustrates an example in which two pedestal portions 71 are disposed at separate places.

The disposition aspect of the coupling antenna holding module 70A illustrated in FIG. 26A is suitable for the test of the DUT 100 having one antenna formation surface 120a. In FIG. 26A, the coupling antenna holding module 70 has the form illustrated in FIGS. 4 and 15, and holds eight coupling antennas 80 using two pedestal portions 71. This coupling antenna holding module 70 is disposed at a position on the bottom surface 51a at which the eight coupling antennas 80 can irradiate the antenna formation surface 120a of the DUT 100.

The disposition aspect of the coupling antenna holding modules 70B and 70C illustrated in FIG. 26B is suitable for the test of a DUT 100 having two antenna formation surfaces 120b and 120 spaced apart. In FIG. 26B, each of the coupling antenna holding modules 70B and 70C has the form illustrated in FIGS. 19 and 20, and holds four coupling antennas 80 on the pedestal portion 71.

The coupling antenna holding module 70B is disposed at a position on the bottom surface 51a at which the four coupling antennas 80 can irradiate the antenna formation surface 120b of the DUT 100. Further, the coupling antenna holding module 70C is disposed at a position on the bottom surface 51a at which the four coupling antennas 80 can irradiate the antenna formation surface 120c of the DUT 100.

Figure 27:
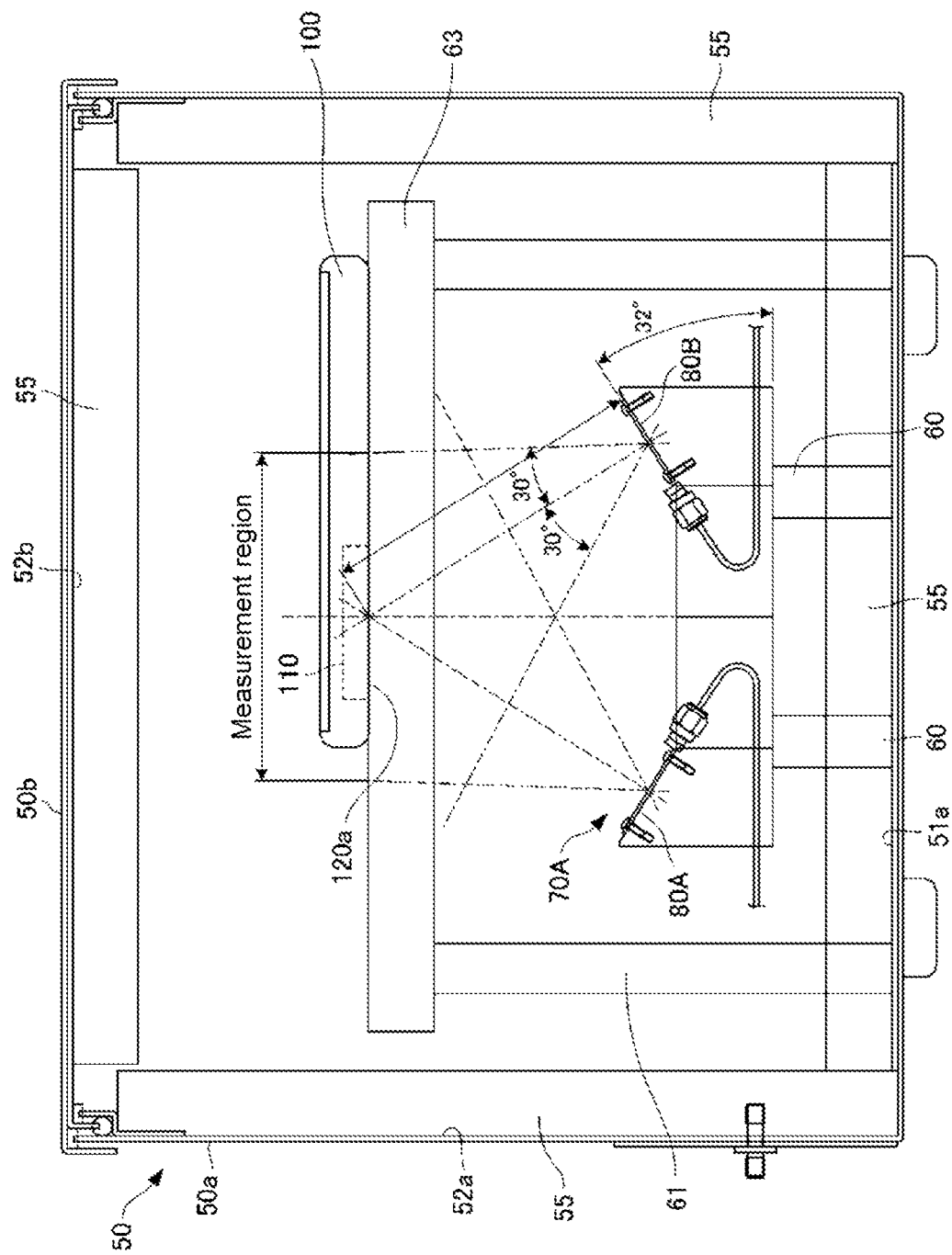
FIG. 27 is a schematic cross-sectional view schematically illustrating a radio wave propagation path of directly facing coupling antennas in a coupling antenna holding module of the electromagnetic wave shield box according to the embodiment of the present invention.

In the electromagnetic wave shield box 50 according to the embodiment, even when any one of the coupling antenna holding modules 70A, 70B, and 70C illustrated in FIGS. 26A and 26B is disposed, effects of suppression of generation of standing waves due to a radio signal emitted from each coupling antenna 80 held by the coupling antenna holding module and reflected waves thereof can be expected (refer FIG. 27).

Next, propagation characteristics of the test signal in the electromagnetic wave shield box 50 of the wireless terminal measurement device 1 according to the embodiment will be described with reference to FIG. 27.

FIG. 27 schematically illustrates a propagation path of a test signal of the DUT 100 in the electromagnetic wave shield box 50 accommodating the coupling antenna holding module 70A in the disposition aspect illustrated in FIG. 26A. In FIG. 27, a structure of the electromagnetic wave shield box 50 is obtained by imitating a structure of a cross section taken along a line E-E in FIG. 26A. However, in FIG. 27, an arrangement position of the coupling antenna holding module 70A is near a center of the bottom surface 51a of the casing body portion 50a, for convenience.

In FIG. 27, the coupling antenna holding module 70A is inclined at an angle of 32 degrees with respect to the horizontal surface so that eight coupling antennas 80 can radiate radio waves toward the same radiation point at the respective upper positions, and is held in a posture rotated by 5 degrees around a center axis C1 of each coupling antenna (see FIGS. 24A and 24B). Each coupling antenna 80 has a radiation angle of 60 degrees, which corresponds to 30 degrees to the left and right with respect to a vertical line of a center position of a rectangular antenna surface from the center position. A region between center positions of the directly facing coupling antennas 80A and 80B is a measurement region.

Each of the coupling antennas 80 is attached to be capable of radiation with one point in the measurement region as a radiation point (a point in which vertical lines at center positions of antenna surfaces of the coupling antennas 80 intersect one another). Each coupling antenna 80 is held by the coupling antenna holding module 70A such that a predetermined height position in a direction perpendicular to the antenna surface from the center of the antenna surface becomes the radiation point. For example, in a case in which the coupling antenna holding module 70A is configured to have the slope of 32 degrees described above, the radiation point is set at a height position of, for example, 10 centimeters (cm) in a direction perpendicular to the antenna surface from the center of the antenna surface. In this case, inside the electromagnetic wave shield box 50, the DUT holding portion 63 holds the DUT 100 such that the antenna formation surface 120a of the DUT 100 is at the height position of the radiation point. Further, the coupling antenna holding module 70A is fixed at a predetermined position on the bottom surface 51a of the casing body portion 50a so that the radiation point is determined in a region corresponding to the mounting region of the antenna 110 on the antenna formation surface of the DUT 100.

In the coupling antenna holding module 70A disposed according to the disposition conditions, the test signal is output from each coupling antenna 80 under test signal output control in step S2 of FIG. 25. The test signal output from each coupling antenna 80 is radiated toward a point (a radiation point) in the measurement region of the DUT 100, reflected by the antenna formation surface of the DUT 100, and further radiated in a reflection direction.

Here, test signals radiated from the respective coupling antennas 80 which are not in a directly facing relationship and reflected by the antenna formation surface of the DUT 100 do not follow the radiation (incidence path) of the other coupling antennas 80 and do not interfere with each other.

On the other hand, for the directly facing coupling antennas 80A and 80B, the test signal radiated from one coupling antenna 80A (80B) is looked like being reflected along the radiation path of the other coupling antenna 80B (80A) when observed in a side cross section illustrated in FIG. 27.

In the structure of the coupling antenna holding module 70A, each coupling antenna 80 is attached in a state in which the coupling antenna 80 is rotated by 5 degrees around a center line C1 of the antenna, as illustrated in FIG. 24B.

With this configuration, in FIG. 27, the test signal output from each of the coupling antennas 80A and 80B directly facing each other is reflected in the direction determined by the rotation angle of each coupling antennas 80A or 80B on the antenna formation surface of the DUT 100, and is radiated in a path shifted from the incident path of the other coupling antenna 80B or 80A. Specifically, in the example of FIG. 27, the test signal emitted from the coupling antenna 80A among the directly facing coupling antennas 80A and 80B is reflected in a direction gradually away from a paper surface on a back surface of the paper surface from one point that is a radiation point, whereas the test signal emitted from the coupling antenna 80B is reflected in a direction gradually away from the paper surface on the surface side of the paper surface from the one point.

Thus, in the embodiment, since the facing coupling antennas 80 held by the coupling antenna holding module 70A are inclined by 5 degrees in the opposite direction, there are no standing waves due to reflection through the DUT 100 or the DUT holding unit between the coupling antennas 80. Therefore, it becomes possible to suppress degradation of test accuracy caused by the standing waves.

Although the propagation path in the OTA test in electromagnetic wave shield box 50 in a case in which the coupling antenna holding module 70A having the disposition aspect illustrated in FIG. 26A is used in FIG. 27 has been described, effects of suppression of standing waves caused by the test signal emitted from each coupling antenna 80 can be expected in the OTA test in a case in which the coupling antenna holding modules 70B and 70C having the disposition aspect illustrated in 26B are used in the embodiment.

In the case of the disposition aspect illustrated in FIG. 26B, there are no directly facing coupling antennas 80 in any one of the coupling antenna holding modules 70B and 70C. In this case, the coupling antennas 80 near both ends of the respective coupling antenna holding modules 70B and 70C are placed in a disposition state close to directly facing. Each of the coupling antennas 80 is also rotated by 5 degrees around the center axis C1 and attached, as illustrated in FIGS. 22 to 24. Therefore, in an OTA test using the electromagnetic wave shield box 50 including the coupling antenna holding modules 70B and 70C illustrated in FIG. 26B, it is possible to obtain an effect of preventing interference between reflected radio waves of the test signals emitted from the respective coupling antennas 80 from occurring between the coupling antennas 80 close to directly facing positions, similar to the directly facing coupling antennas 80 (see FIG. 27).

In the disposition aspect in any of FIGS. 26A and 26B, since the radiation from the plurality of coupling antennas 80 is concentrated on each of the antenna formation surfaces 120a, 120b, and 120c of the DUT 100, it is possible to perform mobility test, and a carrier aggregation (CA) test in which communication is performed using a plurality of LTE carriers simultaneously. Further, since the coupling antenna holding modules 70A, 70B, and 70C illustrated in FIGS. 26A and 26B have a configuration in which a pair of a right hand circular polarization antenna and a left hand circular polarization antenna are used as the coupling antennas 80, it is possible to perform a polarization multiple input multiple output (MIMO) test. Further, in the electromagnetic wave shield box 50 in which the coupling antenna holding modules 70B and 70C of the disposition aspect illustrated in FIG. 26B are mounted, an OTA test of the DUT 100 having the antenna 110s at a plurality of places can be performed through distributed disposition of the coupling antenna holding modules 70B and 70.

As described above, in the electromagnetic wave shield box 50 according to the embodiment, the coupling antenna holding module 70 for coupling antenna holding arranges a plurality of coupling antennas 80 annularly so that the antenna surfaces are directed to a center side of a ring and holds the coupling antennas 80. In particular, the coupling antenna holding module 70 for coupling antenna holding holds the respective coupling antennas 80 in a posture in which the respective coupling antennas 80 are inclined at the same angle with respect to a horizontal surface so that the coupling antennas 80 can radiate radio waves toward the same radiation point in respective upper positions and rotated by a predetermined angle around central axes of the coupling antennas 80.

With this configuration, the electromagnetic wave shield box 50 according to the embodiment can suppress generation of the standing waves by reflecting reflected waves from the DUT 100 in a direction in which the waves do not interfere with each other according to the rotation angle of the coupling antenna 80 while enabling radiation at the same radiation point even when the coupling antennas 80 in a directly facing positional relationship are disposed. Therefore, it is possible to suppress degradation of accuracy of the performance test caused by the standing waves. Further, it is possible to perform the OTA test easily only by fixing the DUT 100 to the DUT holding portion 63. Further, since the radiation from the plurality of coupling antennas 80 is concentrated at the radiation point, it is possible to perform a mobility test and a carrier aggregation test in which communication is simultaneously performed using a plurality of LTE carriers.

Further, in the electromagnetic wave shield box 50 according to the embodiment, the coupling antenna holding module 70 holds the coupling antenna 80 so that a predetermined height position in a direction perpendicular to the antenna surface from a center of the antenna surface becomes a radiation point, and the DUT holding portion 63 holds the DUT 100 so that the antenna formation surface is at a height position corresponding to the radiation point.

With this configuration, in the electromagnetic wave shield box 50 according to the embodiment, the radiation point of each coupling antenna 80 can be easily recognized on the basis of a slope angle of each coupling antenna 80 and a height from a center of each coupling antenna 80 to the radiation point defined in advance, and work of setting the device under test under consideration of the radiation point and a place of the antenna formation surface of the DUT 100 is facilitated.

Further, in the electromagnetic wave shield box 50 according to the embodiment, the coupling antenna holding module 70 is fixed at a predetermined position on the bottom surface 51a so that the radiation point is determined in a region corresponding to the antenna mounting region on one surface of the DUT 100.

With this configuration, the electromagnetic wave shield box 50 according to the embodiment can determine the radiation point in the region corresponding to the antenna mounting region of the DUT 100 and reliably radiate test signals from each coupling antenna 80.

Further, in the electromagnetic wave shield box 50 according to the embodiment, the coupling antenna holding module 70 is constituted by an assembly of the antenna attachment stand 72 having the two antenna attachment surfaces 72c1 and 72c2, and the pedestal portion 71 having the two stand attachment surfaces 71c1 and 71c2. In the antenna attachment stand 72, the coupling antenna 80 can be attached to at least one of the two antenna attachment surfaces 72c1 and 72c2, and in the pedestal portion 71, the antenna attachment stand 72 to which the coupling antenna has been attached, can be attached to at least one of the two stand attachment surfaces 71c1 and 71c2.

With this configuration, in the electromagnetic wave shield box 50 according to the embodiment, one or two antenna attachment stands 72 can be attached onto the pedestal portion 71, or two pedestal portions 71 can be attached at different places. A user can select a desired configuration and perform a performance test without waste of the DUT 100. Further, a performance test of the DUT 100 having a plurality of coupling antennas 80 can be performed through the division arrangement of the pedestal portions 71.

Further, in the electromagnetic wave shield box 50 according to the embodiment, in the antenna attachment stand 72, the two antenna attachment surfaces 72c1 and 72c2 are formed so that the two coupling antennas 80 can be attached to the two antenna attachment surfaces 72c1 and 72c2 at angles of 45 degrees in a circumferential direction of the ring, and in the pedestal portion 71, the two stand attachment surfaces 71c1 and 71c2 are formed so that the two antenna attachment stands 72 can be attached to the two stand attachment surfaces 71c1 and 71c2 at angles of 45 degrees in a circumferential direction of the ring.

With this configuration, in the electromagnetic wave shield box 50 according to the embodiment, a maximum of four coupling antennas 80 can be attached onto one pedestal portion 71, and a system configuration desired by the user can be easily constructed.

Further, in the electromagnetic wave shield box 50 according to the embodiment, the pedestal portion 71 is configured as block members obtained by dividing a plate member having a regular octagon in two to be bilaterally symmetrical with a straight line connecting respective middle points of one side of the regular octagon and a side facing the one side.

With this configuration, the electromagnetic wave shield box 50 according to the embodiment can be assembled in a regular octagonal shape by causing the two pedestal portions 71 to face each other, and a maximum of eight coupling antennas can be disposed annularly. In this case, it is possible to prevent generation of standing waves for each of the coupling antennas 80 disposed at the positions directly facing each other.

Further, the electromagnetic wave shield box 50 according to the embodiment, the fixing portion 59 includes a plurality of mount members 60 that are erected on the bottom surface 51a and provided at predetermined installation intervals in vertical and horizontal directions, and the pedestal portion 71 includes the two insertion holes 71d1 and 71d2 which are provided at intervals corresponding to the installation intervals of the mount members 60 and into which the mount members 60 are inserted detachably.

With this configuration, in the electromagnetic wave shield box 50 according to the embodiment, the two mount members 60 at any positions are inserted into the two mount insertion holes 71d1 and 71d2 of the pedestal portion 71, respectively. Therefore, the pedestal portion 71 and the coupling antenna 80 can be disposed at a position corresponding to the mount member 60 on the bottom surface 51a of the casing body portion 50a, and the disposition change becomes easy. When position adjustment of the pedestal portion 71 is necessary according to the antenna formation surface of the DUT 100, the radiation from each coupling antenna 80 is concentrated on the radiation point along a vertical direction of the antenna attachment stand 72. Therefore, the position adjustment can be easily performed.

Further, in the electromagnetic wave shield box 50 according to the embodiment, the DUT holding portion 63 is configured as a transparent member having radio wave transparency or an opaque member in which an opening window penetrating in a thickness direction is formed in a portion of the holding surface holding the DUT 100.

With this configuration, in the electromagnetic wave shield box 50 according to the embodiment, since the annular disposition of the coupling antennas 80 can be visually recognized, it is possible to easily recognize the radiation point, and to easily and accurately perform setting work for the DUT 100 for aligning the antenna formation surface of the DUT 100 with the radiation point.

Further, the electromagnetic wave shield box 50 according to the embodiment further includes a connection portion cover 75 that covers, via the metal connector 73, the connection portion 77 that electrically connects the coupling antenna 80 to the feed line 74 that supplies the test signal of the DUT 100, from the upper side below the coupling antenna 80.

With this configuration, the electromagnetic wave shield box 50 according to the embodiment can regulate radiation of reflected waves to the connector 73 by the DUT 100 from each coupling antenna 80 with respect to the connector 73 by the connection portion cover 75, and can suppress degradation of accuracy of a performance test.

Further, in the electromagnetic wave shield box 50 according to the embodiment, the circular polarization antenna 20 is used as the coupling antenna 80, and a set of circular polarization antennas 20 of two types including right hand circular polarization and left hand circular polarization are attached to the antenna attachment stand 72.

With this configuration, the electromagnetic wave shield box 50 according to the embodiment can receive radio waves transmitted from a set of two types of circular polarization antennas 20 using the antenna 110 of the DUT 100 and separate the radio waves into two. Accordingly, it is possible to execute a polarization multiple input multiple output (MIMO) test using planar spiral antennas of right hand circular polarization and left hand circular polarization.

Further, in the electromagnetic wave shield box 50 according to the embodiment, the circular polarization antenna 20 includes a dielectric substrate 21, a ground plate conductor 22 that is superimposed on one surface 21a of the dielectric substrate 21, a circular polarization antenna element 23 formed on an opposite surface 21b of the dielectric substrate 21 facing the one surface 21a of the DUT 100, a plurality of cylindrical metal posts 30 that has one end side connected to the ground plate conductor 22, each of the metal posts penetrating the dielectric substrate 21 in a thickness direction thereof, and the other end side of each of the metal posts 30 extending to the opposite surface of the dielectric substrate 21, the metal posts being provided at predetermined intervals to surround the antenna element 23 and constitute a cavity, and a frame-shaped conductor 32 in which a rim short-circuiting the other end sides of the plurality of metal posts 30 in an arrangement direction thereof and having a predetermined width in an antenna element 23 direction is provided on the opposite surface side of the dielectric substrate 21. In the circular polarization antenna 20, the cavity and the frame-shaped conductor 32 constitute a resonator, structural parameters of the resonator and the antenna element 23 are adjusted to set a resonance frequency of the resonator to a desired value, the structural parameters include at least one of an inner dimension Lw of the cavity, a rim width LR of the frame-shaped conductor, the number of turns of the antenna element 23, a basic length a0 of the antenna element 23, and an element width W of the antenna element 23, and the rim width LR of the frame-shaped conductor 32 is approximately ¼ of a wavelength of surface waves propagating along a surface of the dielectric substrate 21.

With this configuration, the electromagnetic wave shield box 50 according to the embodiment can suppress an amplitude error caused by the multiple reflections of the signal under measurement between the antenna 110 of the DUT 100 and the circular polarization antenna 20, and improve performance test accuracy for the DUT 100.

As described above, the electromagnetic wave shield box according to the present invention achieves effects of suppressing generation of standing waves caused by radio waves radiated from coupling antennas that are in a directly facing relationship and realizing an accurate performance test in a performance test under an OTA environment of a device under test using a radio signal in a millimeter wave band, and is useful for all electromagnetic wave shield boxes that perform a performance tests of a wireless terminal having high-speed communication capability such as a wireless terminal for 5G.

DESCRIPTION OF REFERENCE NUMERALS AND SIGNS 1 wireless terminal measurement device
20 circular polarization antennas
21 dielectric substrate
21a one side
21b opposite side
22 ground conductor
23 antenna element
30 metal post
32 frame-shaped conductor
50 electromagnetic wave shield box
50a casing body portion
50b lid portion
51a bottom surface
55 wave absorber
59 fixing portion
60 mount member
63 DUT holding portion (device-under-test holding portion)
70 coupling antenna holding module (coupling antenna holding portion)
71 pedestal portion
71c1, 71c2 stand attachment surface
71d1, 71d2 mount insertion hole (insertion hole)
72 antenna mount
72c1, 72c2 antenna attachment surface
74 feed line
77 connection portion
75 connection portion cover
80 coupling antenna
100 DUT (device under test)
110 antenna

What is claimed is:

1. An electromagnetic wave shield box including a casing body portion in which a device under test having an antenna on one surface and performs communication using a radio signal in a millimeter wave band is able to be installed, and a coupling antenna having a flat antenna surface and spatially coupled to the antenna, in the casing body portion, the electromagnetic wave shield box shielding penetration of electromagnetic waves from the outside, the electromagnetic wave shield box comprising:
a coupling antenna holding portion that arranges a plurality of the coupling antennas annularly so that the antenna surfaces are directed to a center side of a ring and holds the coupling antennas;
a fixing portion that fixes the coupling antenna holding portion to a bottom surface of the casing body portion; and
a device-under-test holding portion that horizontally holds the device under test so that the one surface is directed to the coupling antenna, at a position spaced from the coupling antenna above the coupling antenna,
wherein the coupling antenna holding portion holds each coupling antenna in a posture in which the coupling antennas are inclined in the same way by a first angle with respect to a horizontal surface so that the coupling antennas are able to radiate radio waves to the device under test at the respective upper positions, a bottom angle of an isosceles triangle is set to the first angle, the ring is set to a bottom surface, a segment connecting an apex of a cone extending in the horizontal surface to a center of the coupling antenna is set to a rotation axis, and each coupling antenna is rotated by a second angle.

2. The electromagnetic wave shield box according to claim 1, wherein the casing body portion further comprises:
a lid portion that has an upper surface as an opening and is supported by the casing body portion so that the opening is able to be opened and closed; and
a radio wave absorber pasted to inner surfaces of the casing body portion and the lid portion.

3. The electromagnetic wave shield box according to claim 2,
wherein the coupling antenna holding portion holds each coupling antenna so that a predetermined height position in a direction perpendicular to the antenna surface from a center of the antenna surface becomes a point determined from the first angle, and
the device-under-test holding portion holds the device under test so that the one surface is at a height position corresponding to an apex of an isosceles triangle having an angle twice the first angle as an apex angle and a diameter of the ring as a bottom side.

4. The electromagnetic wave shield box according to claim 3,
wherein the coupling antenna holding portion is fixed at a predetermined position on the bottom surface so that the apex of the isosceles triangle is determined in a region corresponding to an antenna mounting region on the one surface of the device under test.

5. The electromagnetic wave shield box according to claim 4,
wherein the coupling antenna holding portion is constituted by an assembly of an antenna attachment stand having two antenna attachment surfaces, and a pedestal portion having two stand attachment surfaces,
in the antenna attachment stand, the coupling antenna is able to be attached to at least one of the two antenna attachment surfaces, and
in the pedestal portion, the antenna attachment stand to which the coupling antenna has been attached is able to be attached to at least one of the two stand attachment surfaces.

6. The electromagnetic wave shield box according to claim 5,
wherein in the antenna attachment stand, the two antenna attachment surfaces are formed so that the two coupling antennas are able to be attached to the two antenna attachment surfaces at angles of 45 degrees in a circumferential direction of the ring, and
in the pedestal portion, the two stand attachment surfaces are formed so that the two antenna attachment stands are able to be attached to the two stand attachment surfaces at angles of 90 degrees in the circumferential direction of the ring.

7. The electromagnetic wave shield box according to claim 6,
wherein the pedestal portion is configured as block members obtained by dividing a plate member having a regular n-gon shape having n or more sides in two to be bilaterally symmetrical with a straight line connecting respective middle points of one side of the regular n-gon shape and a facing side facing the one side.

8. The electromagnetic wave shield box according to claim 7,
- wherein the fixing portion includes a plurality of columnar mount members that are erected on the bottom surface and provided at predetermined installation intervals in vertical and horizontal directions, and
- the pedestal portion includes two insertion holes that are provided at intervals corresponding to the installation intervals of the mount members and into which the mount members are inserted detachably.

9. The electromagnetic wave shield box according to claim 8,
- wherein the device-under-test holding portion is configured as a transparent member having radio wave transparency or an opaque member in which an opening window penetrating in a thickness direction is formed in a portion of a holding surface holding the device under test.

10. The electromagnetic wave shield box according to claim 9, further comprising:
- a connection portion cover that covers the connection portion that electrically connects, via a metal connector, the coupling antenna to the feed line that supplies a test signal of the device under test, from an upper side below the coupling antenna.

11. The electromagnetic wave shield box according to claim 1,
- wherein the coupling antenna holding portion holds each coupling antenna so that a predetermined height position in a direction perpendicular to the antenna surface from a center of the antenna surface becomes an apex of an isosceles triangle having an angle twice the first angle as an apex angle and a diameter of the ring passing through a center of the coupling antenna as a bottom side, and
- the device-under-test holding portion holds the device under test so that the one surface is at a height position corresponding to an apex of an isosceles triangle having an angle twice the first angle as an apex angle and a diameter of the ring as a bottom side.

12. The electromagnetic wave shield box according to claim 11,
- wherein the coupling antenna holding portion is fixed at a predetermined position on the bottom surface so that the apex of the isosceles triangle is determined in a region corresponding to an antenna mounting region on the one surface of the device under test.

13. The electromagnetic wave shield box according to claim 1,
- wherein the coupling antenna holding portion is constituted by an assembly of an antenna attachment stand having two antenna attachment surfaces, and a pedestal portion having two stand attachment surfaces,
- in the antenna attachment stand, the coupling antenna is able to be attached to at least one of the two antenna attachment surfaces, and
- in the pedestal portion, the antenna attachment stand to which the coupling antenna has been attached is able to be attached to at least one of the two stand attachment surfaces.

14. The electromagnetic wave shield box according to claim 13,
- wherein in the antenna attachment stand, the two antenna attachment surfaces are formed so that the two coupling antennas are able to be attached to the two antenna attachment surfaces at angles of 45 degrees in a circumferential direction of the ring, and
- in the pedestal portion, the two stand attachment surfaces are formed so that the two antenna attachment stands are able to be attached to the two stand attachment surfaces at angles of 90 degrees in the circumferential direction of the ring.

15. The electromagnetic wave shield box according to claim 13,
- wherein the pedestal portion is configured as block members obtained by dividing a plate member having a regular n-gon shape having n or more sides in two to be bilaterally symmetrical with a straight line connecting respective middle points of one side of the regular n-gon shape and a facing side facing the one side.

16. The electromagnetic wave shield box according to claim 13,
- wherein the fixing portion includes a plurality of columnar mount members that are erected on the bottom surface and provided at predetermined installation intervals in vertical and horizontal directions, and
- the pedestal portion includes two insertion holes that are provided at intervals corresponding to the installation intervals of the mount members and into which the mount members are inserted detachably.

17. The electromagnetic wave shield box according to claim 13,
- wherein the coupling antenna is a circular polarization antenna, and
- a set of circular polarization antennas of two types including right hand circular polarization and left hand circular polarization are attached to the antenna attachment stand.

18. The electromagnetic wave shield box according to claim 17,
- wherein the circular polarization antenna includes
  - a dielectric substrate;
  - a ground plate conductor that is superimposed on one surface of the dielectric substrate;
  - a circular polarization antenna element formed on an opposite surface of the dielectric substrate facing one surface of the device under test;
  - a plurality of metal posts that has one end side connected to the ground plate conductor, each of the metal posts penetrating the dielectric substrate in a thickness direction thereof, and the other end side of each of the metal posts extending to the opposite surface of the dielectric substrate, the metal posts being provided at predetermined intervals to surround the antenna element and constitute a cavity; and
  - a frame-shaped conductor in which a rim short-circuiting the other end sides of the plurality of metal posts in an arrangement direction thereof and having a predetermined width in an antenna element direction is provided on the opposite surface side of the dielectric substrate, and
- the cavity and the frame-shaped conductor constitute a resonator, structural parameters of the resonator and the antenna element are adjusted to set a resonance frequency of the resonator to a desired value, the structural parameters include at least one of an inner dimension Lw of the cavity, a rim width LR of the frame-shaped conductor, the number of turns of the antenna element, a basic length a0 of the antenna element, and an element width W of the antenna element, and the rim width LR of the frame-shaped conductor is a width of approximately ¼ of a wavelength of surface waves propagating along a surface of the dielectric substrate.

19. The electromagnetic wave shield box according to claim 1,
   wherein the device-under-test holding portion is configured as a transparent member having radio wave transparency or an opaque member in which an opening window penetrating in a thickness direction is formed in a portion of a holding surface holding the device under test.

20. The electromagnetic wave shield box according to claim 1, further comprising:
   a connection portion cover that covers the connection portion that electrically connects, via a metal connector, the coupling antenna to the feed line that supplies a test signal of the device under test, from an upper side below the coupling antenna.

* * * * *